United States Patent [19]

Mansfield et al.

[11] Patent Number: 5,764,059
[45] Date of Patent: Jun. 9, 1998

[54] ACOUSTIC SCREEN

[75] Inventors: Peter Mansfield, Bramcote; Richard William Bowtell, Nottingham; Barry Leonard Walter Chapman, Stapleford; Paul Martin Glover, Chilwell, all of England

[73] Assignee: British Technology Group Limited, London, England

[21] Appl. No.: 556,941

[22] PCT Filed: Jun. 1, 1994

[86] PCT No.: PCT/GB94/01187

§ 371 Date: Dec. 1, 1995

§ 102(e) Date: Dec. 1, 1995

[87] PCT Pub. No.: WO94/28430

PCT Pub. Date: Dec. 8, 1994

[30] Foreign Application Priority Data

Jun. 2, 1993 [GB] United Kingdom ............ 9311321

[51] Int. Cl.$^6$ ..................................... G01V 3/00
[52] U.S. Cl. ................................. 324/318; 324/319
[58] Field of Search .......................... 324/318, 319, 324/322, 309, 314, 316; 335/296, 299; 128/653.5

[56] References Cited

U.S. PATENT DOCUMENTS

| 4,680,545 | 7/1987 | Gray et al. ............... | 324/307 |
| 4,878,024 | 10/1989 | Overweg et al. .......... | 324/319 |
| 5,018,359 | 5/1991 | Horikawa et al. .......... | 62/51.1 |
| 5,084,676 | 1/1992 | Saho et al. ............... | 324/318 |
| 5,198,769 | 3/1993 | Frese et al. .............. | 324/318 |
| 5,235,283 | 8/1993 | Lehne et al. .............. | 324/318 |
| 5,243,286 | 9/1993 | Rzedzian et al. .......... | 324/318 |
| 5,345,177 | 9/1994 | Sato et al. ............... | 324/318 |
| 5,554,929 | 9/1996 | Doty et al. ............... | 324/318 |
| 5,572,131 | 11/1996 | Rzedzian ................... | 324/318 |

FOREIGN PATENT DOCUMENTS

| 0 304 127 | 2/1989 | European Pat. Off. |  |
| 2704322 | 10/1994 | France .................... | 324/318 |
| 4020593 A1 | 1/1991 | Germany . |  |
| 41 41 514 A1 | 8/1992 | Germany . |  |
| 91/19209 | 12/1991 | WIPO . |  |

OTHER PUBLICATIONS

Patent Abstract of Japan, vol. 14, No. 90 (C–691) (4033) 20 Feb. 1990.
Patent Abstract of Japan, vol. 16, No. 295 (C957) (5338) 30 Jun. 1992.

*Primary Examiner*—Louis M. Arana
*Attorney, Agent, or Firm*—Cushman, Darby & Cushman IP Group of Pillsbury, Madison & Sutro LLP

[57] ABSTRACT

The invention describes apparatus for, and a method of, active acoustic screening and combined active acoustic and magnetic screening, of magnetic field coils, which pass a time varying current and which reside in relatively high static magnetic fields, typically greater than about 0.1 T. The invention is particularly well suited for acoustic screening of magnetic field gradient coils used in Magnetic Resonance Imaging (MRI). In a preferred embodiment a closed loop carrying current is arranged such that two different parts of the loop are mechanically coupled, dimensioned and arranged with respect to one another such that Lorentz forces experienced by the magnetic equipment are substantially reduced and preferably cancelled.

In a different embodiment the invention is modified so as to permit simultaneous magnetic and acoustic screening.

The invention overcomes existing problems of non-acoustically screened coils used in conjunction with high magnetic fields, by by reducing vibrational forces by cancelling them, within the gradient coil structure, rather than damping or absorbing emitted high levels of acoustic noise.

17 Claims, 22 Drawing Sheets

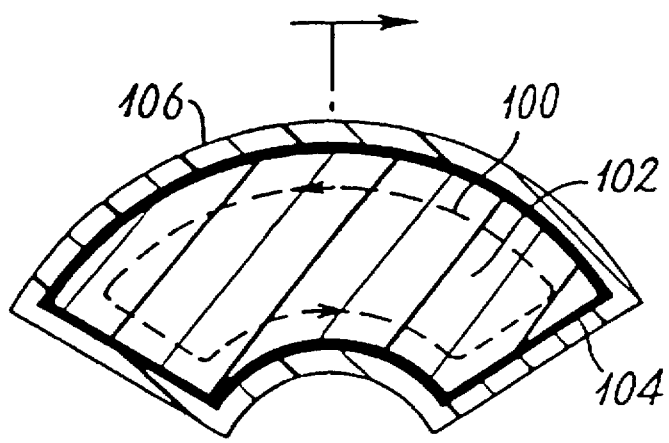
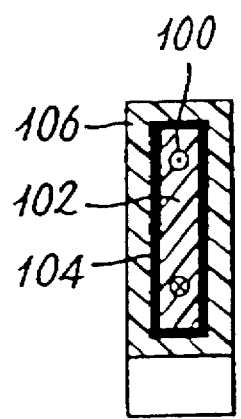
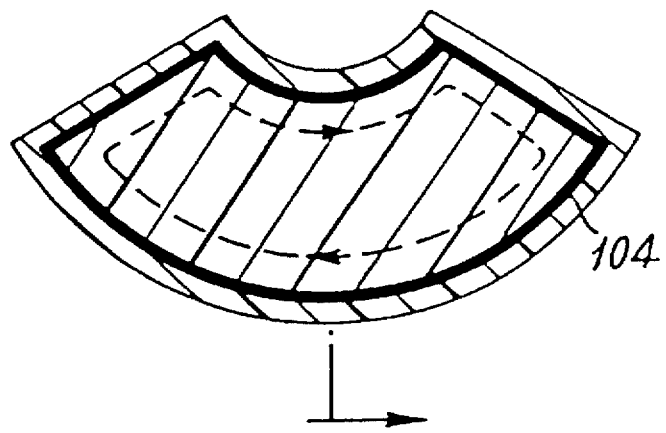
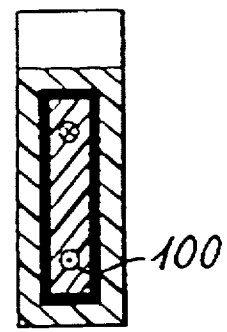
Fig.17  Fig.17a

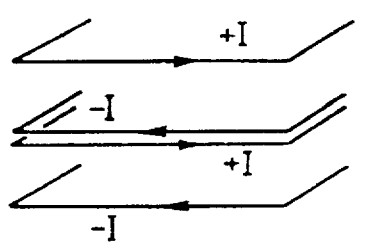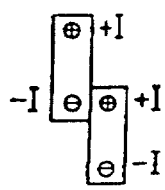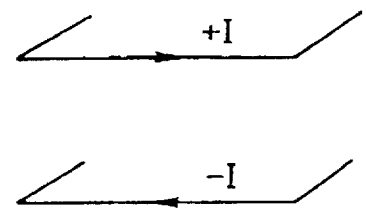
Fig. 39a　　　Fig. 39c　　　Fig. 39b
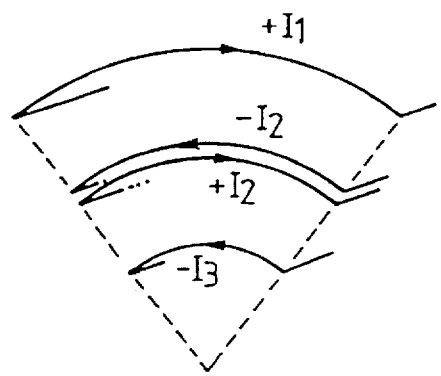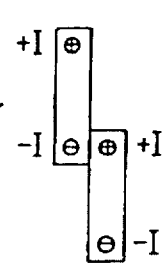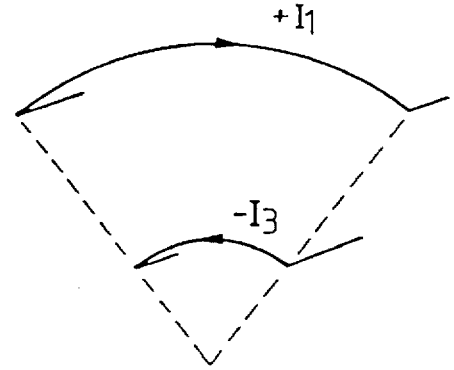
Fig. 40a　　　Fig. 40c　　　Fig. 40b
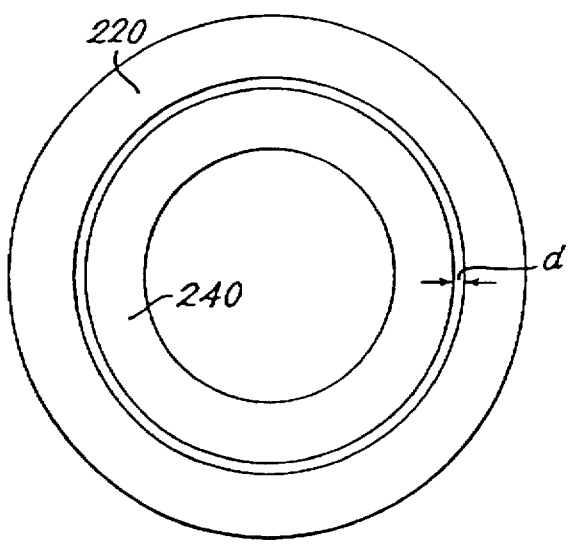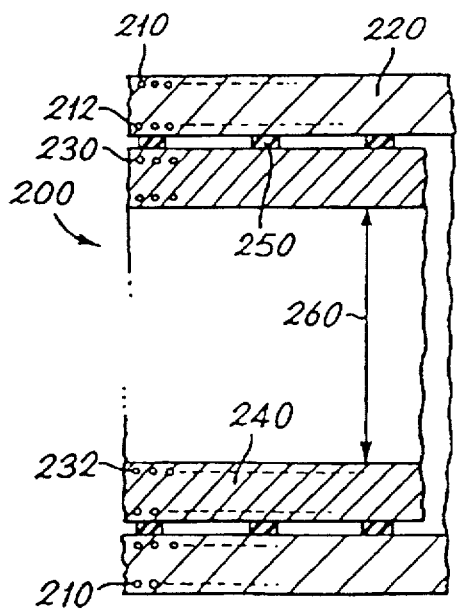
Fig. 41a　　　Fig. 41b

ACOUSTIC SCREEN

BACKGROUND AND SUMMARY OF THE INVENTION

This invention relates to an apparatus for and a method of acoustic and magnetic screening of coils through which pass rapidly varying currents which interact with a surrounding static magnetic field to produce strong Lorentz forces. The invention, hereinafter referred to as an active acoustic screen or acoustic screen, is particularly well suited for use with Magnetic Resonance Imaging (MRI) also known as Nuclear Magnetic Resonance (NMR) imaging. More particularly the invention relates to an apparatus and method of active acoustic screening of any coil structure which lies in a static magnetic field and which produces unwanted noise by virtue of a variable current drive through the coil. Additionally, there is provided an embodiment in which simultaneous active acoustic and active magnetic screening of a coil structure in a static magnetic field is achieved.

Particular application of the invention is in MRI or NMR equipment where gradient coils are pulsed in the presence of a static magnetic field. Although noise is generated at any field strength, the invention has particular relevance to situations in MRI where field strengths are 0.1 T (Tesla) or above. For consistency NMR equipment is hereinafter referred to as MRI equipment.

Magnetic gradient coils are a prerequisite for MRI (as discussed by Mansfield P. and Morris P. G. in NMR imaging in Biomedicine Academic Press (1982) N.Y.) and also for use in a range of applications including diffusion studies and flow. In medical imaging, acoustic noise associated with rapid gradient switching, is exacerbated at higher static magnetic field strengths, and is at best an irritant and at worst could be damaging to a patient. Some degree of protection can be given to adults and children by using ear defenders. However, for foetal studies and also for studies using animals and for veterinary use in general, acoustic protection is difficult if not impossible.

Several attempts have been made to ameliorate the acoustic noise problem. For example, by lightly mounting coils on rubber cushions, by increasing the mass of the total gradient arrangement and by absorptive techniques in which acoustic absorbing foam was used to deaden the sound. The problem of acoustic noise has been considered in published European Patent Applications EP-A1-431216, EP-A2-350640 and EP-A1-304127. Acoustic screening was also considered in U.S. Pat. No. 4,680,545, U.S. Pat. No. 5,018,359 and published International Patent Application No. WO-A1-8607459. These are briefly considered below.

U.S. Pat. No. 4,680,545 describes a method for shaping a current pulse such that high frequency components are reduced or eliminated. This reduced some high frequency noise.

EP-A1-431216 describes a technique for minimising the pulse rise and fall times by pulse shaping. This removes a high frequency noise component.

EP-A1-304127 describes an arrangement comprising a stack of arc conductors connected to a former in a rigid self-supporting arrangement. The arrangement is such that relative movement between arc conductors is reduced. This reduces the amount of vibration which caused acoustic noise. WO-A1-8607459 describes an arrangement in which coils are embedded in epoxy and/or suspended on rubber dampers. In one embodiment a stainless steel mass is attached to a coil and this is used to lower the characteristic frequency of the system. Noise was reduced by acoustic absorbtion and/or damping of vibrating equipment.

EP-A2-350640 describes an arrangement in which gradient coils are embedded in layer of viscoelastic material. The layer is then sandwiched so as to restrain it.

U.S. Pat. No. 5,018,359 describes a cryogenically cooled apparatus in which a magnetic field produced by a superconductive coil is screened by a magnetic screen and which is connected to a vacuum vessel by a vibration absorbing means.

Techniques have also been proposed in which acoustic noise cancellation is used. In this method earphones or sound pipes are used to transmit sound of equal but opposite amplitude in the region of a patient's head, thereby cancelling the noise over a restricted region. Cancellation techniques of this sort are frequency and position dependent and could possibly lead to accidents where, rather than cancel the noise, the noise amplitude is increased.

U.S. Pat. No. 5,198,769 describes a tesseral gradient coil disposed within a magnetic coil. The gradient coil comprises a plurality of closed loop coils arranged to reduce induced eddy currents in a subject under examination.

Published International Patent Application WO-A1-9119209 describes an arrangement for acoustic screening of magnetic coils. The arrangement comprises at least two generally concentric cylindrical members which support one or more coils. The two cylindrical members are bonded together by providing a filler between them. Alternatively the coils supported on each cylindrical surface may be formed by building up successive layers of material and then removing some portions of material but not others in order to define a pathway for a current. This is not difficult if the pathway, for example, follows a simple helix across the surface of a cylinder, as such a pathway can be easily formed say by a lathe or milling machine. However, gradient coils often comprise complex shaped pathways which require careful winding. It is difficult to employ a lathe or milling machine to cut away material, such that complex, non-helical pathways are formed.

UK-B-2180943 describes and claims a magnetically screened coil assembly in which the electrical current distribution in a conductor approximates to an induced current in a hypothetical superconductive metal surface, so as to magnetically screen the said coil.

The arrangements described, in the above mentioned prior art, did not address the problem of vibrations occurring as a result of radial and torsional stresses.

All the above techniques describe what may be termed passive or at best, "semi-passive", arrangements which attempted to reduce noise, but did not actually address the cause of the noise, that is, vibration in magnetic coils. The arrangements UK-B-2180943 describes and claims a magnetically screened coil assembly in which the electrical current distribution in a conductor approximates to an induced current in a hypothetical superconductive metal surface, so as to magnetically screen the said coil.

The arrangements described, in the above mentioned prior art, did not address the problem of vibrations occurring as a result of radial and torsional stresses.

All the above techniques describe what may be termed passive or at best, "semi-passive", arrangements which attempted to reduce noise, but did not actually address the cause of the noise, that is, vibration in magnetic coils. The arrangements described above are therefore limited by the absorption characteristics of the material used or the precision to which pulses can be pre-shaped or the frequency response of resilient dampers. The problem of vibration is still present in coil structures when current through them is modulated, especially in the higher magnetic fields which are now being used. High magnetic fields are generally considered to be those above about 0.1 T (Tesla), although the invention can be used in lower magnetic fields.

The present invention arose from a consideration of the above mentioned problems.

According to the present invention there is provided an acoustically screened magnetic coil which is adapted to be placed in a static magnetic field, the coil comprising an electrically conductive pathway, the pathway having first and second portions, which portions carry first and second currents, such that a first Lorentz force acting on the first portion of the pathway acts to substantially reduce a second Lorentz force acting on the second portion of the pathway, characterised in that the first and second portions are mechanically coupled.

Preferably the first and second portions are mechanically coupled such that a resultant force, whose components comprise two or more Lorentz forces, is substantially reduced in magnitude, and is preferably zero. This may be achieved by using a potting material such as synthetic plastic or resin. Alternatively, other materials may have a preformed groove in them for receiving an electrical conductor which defines the first and second portions, the material forming a slab to receive the conductor and restrain it in the groove.

The above mentioned published International Application No. WO-A1-9119209 produces magnetic screening, but achieves only partial acoustic screening, as resultant Lorentz forces acting on a coil arrangement still exist.

Similarly U.S. Pat. No. 5,198,769 is not considered to be relevant, as a constant current in an open loop system (for example as shown, in the embodiment in FIG. 11), would not achieve cancellation of Lorentz forces, in contra distinction to the present invention. Thus such a reference to the arrangement serving to reduce noise, is not considered to be an enabling description.

Preferably the acoustically screened magnetic coil comprises a closed loop, an inner portion, defining the first pathway and an outer portion defining the second pathway. However, an open loop coil may be used, in which case the pathways are defined by separate wires.

A plurality of first and second electrical pathways may be dimensioned and arranged so as to form a series of nested, closed loops. In such an arrangement the closed loops preferably comprise a first electrical path, defined by a first arcuate portion of the closed loop and a second electrical path defined by a second arcuate portion of the closed loop. Arcuate portions are preferably radially registered as hereinafter defined.

Superimposition of two or more coils may be carried out so as to reduce the size and mass of the apparatus. The apparatus may be used in magnetic resonance imaging, for example for producing a gradient magnetic field. Similarly additional acoustic screening may be provided by further coils.

According to a further aspect of the present invention there is provided a method of acoustically screening a magnetic gradient coil comprising the steps of: establishing a magnetic field gradient by passing an electrical current along a first portion of an electrical pathway and passing an electrical current along a second portion of an electrical pathway such that a first Lorentz force acting on the first portion is substantially cancelled by a second Lorentz force acting on the second portion and arranging the two portions to be mechanically coupled.

According to another aspect of the present invention there is provided a method of producing an active magnetically and active acoustically screened magnetic coil comprising the steps of:

establishing a magnetic field gradient with a first coil arrangement, actively acoustically screening the first coil arrangement with a second coil arrangement (as hereinbefore described), actively magnetically screening the first and second coil arrangements with a third coil arrangement; and actively acoustically screening the third coil arrangement with a fourth coil arrangement, said first and second coil arrangements being mechanically coupled to one another; and said third and fourth coil arrangements being mechanically coupled to one another.

Optionally one or more additional acoustic screens may be introduced into the arrangement.

Preferably the method of producing a magnetic field gradient is incorporated into a method of magnetic resonance imaging and comprises the steps of simultaneously subjecting an object to a first magnetic field gradient provided by a first coil; actively magnetically screening the first magnetic field gradient with a second magnetic field gradient provided by a second coil; and establishing a third magnetic field gradient provided by the third coil which produces Lorentz forces which substantially cancel Lorentz forces caused by the first and second magnetic coils.

Preferably the Lorentz force produced by the third magnetic coil is substantially equal and opposite to the sum of Lorentz forces, caused by the first and second coils, and thereby cancelling vibrations.

Mechanical coupling of the coils may be achieved by using rigid connecting members or struts. Coupling is preferably achieved by potting or flooding coils in a suitable synthetic plastic material.

A preferred combined acoustic and active magnetic screen incorporates an active magnetic screen arrangement which is similar to that described in the Applicant's granted UK Patent 2180943 B. The contents of which are incorporated herein by reference. The arrangement may be modified with the present invention such that vibrational forces are balanced, thus providing an acoustic screen. The result is a magnetic coil arrangement which is actively, magnetically and acoustically screened, is suitable for use with MRI apparatus and which is able to operate in the range above 0.1 T (Tesla) with reduced acoustic noise than has heretofore been achievable.

Advantageously, radial and torsional forces are removed by the acoustic screen as cancellation of Lorentz forces ensures there is no resultant force.

The coils and the screens may be coaxial and concentric about a single axis. Advantageously an acoustically quiet coil adapted for use in a magnetic field, or for generating a magnetic gradient which when used in conjunction with a static magnetic field, is force balanced such that for every pathway in a primary coil there is positioned in the acoustic screen a radially registered wire pathway which carries a current of opposite polarity to that in the primary coil and whose magnitude is arranged to exactly balance the Lorentz forces on the pathways when coupled mechanically and in which acoustic attenuation is a function of $\sin(\pi f x/v)$ in which f is the acoustic frequency and v the velocity of sound in the connecting material.

Preferably an acoustically screened coil includes a primary coil and a plurality of balanced acoustic screens (n), each screen comprising a composite segmented acoustic screen, such that a gap between a wire forming a primary coil and its respective acoustic screen can be reduced, thereby increasing acoustic attenuation and extending its frequency range by exploiting Ampere's circuital theorem. This is achieved by ensuring the gradient field strength efficacy of the coil structure is undiminished over the whole coil structure by employing a single acoustic screen placed at a distance x from the primary acoustic screen and in which the acoustic attenuation, at a frequency f is a function of sin(πfx/nv) where v is the acoustic velocity of compressional waves in the connecting material for each segment of the composite acoustic screen. The theory of this embodiment is described below.

Preferably an arrangement for producing a magnetic field gradient comprises a first coil for producing a magnetic field gradient; a second coil adapted to surround at least a portion of the first coil and which is capable of establishing a magnetic field gradient and which produces forces which oppose Lorentz forces by the first coil arrangements; and a third coil arrangement adapted to surround at least a portion of the first and second coil arrangements and actively magnetically screen the first coil arrangement.

It is also possible to combine coils such that the first coil becomes a primary coil, the second coil combines the acoustic and magnetic screen of the primary coil, while the third coil is the magnetic screen for the primary coil.

Preferred arrangements in effect incorporate two of the aforementioned coils into one coil by superimposition of coils. Thus simultaneous acoustic and magnetic screening is achievable with at least three independent coils, although it will be appreciated that four or more coils may be used. In effect superimposition of two coils, and therefore current distributions, reduces the amount of material and makes for a smaller arrangement which is easier and cheaper to manufacture.

Preferably the vector sum of radial forces produced by the first, second and third coils (or combination of fourth and higher order coils arrangements) combine so that the resultant force is zero. When this is achieved all mechanical vibration is removed and the arrangement is silent. This occurs only when wire conductors which define each coil are mechanically connected to corresponding wires on the other coils with a material with a high acoustic velocity at the desired operating frequency. Preferably wire conductors are arranged to be radially registered. That is coils lie on concentric cylinders and are connected to one another by an electrically non-conducting connector lying substantially on a radius, defined by a line bounded at one end by the common axis of said cylinders.

A preferred arrangement is therefore for the above mentioned radially registered, force balanced coil arrangement to be potted or encased in a setting resin such as epoxy or any other similar filler material which is strong and has a high sound propagation velocity. Microscopic motion of individual wires may still be possible. Dimensions of coil arrangements change on heating. Therefore in order to enhance acoustic screening, the coil arrangement may be further potted or encased in an epoxy resin together with a sound absorbing material to form a composite filler material which can absorb high frequency noise components.

Similarly other pulse shaping techniques may also be used in combination with the coil arrangement and this could further reduce the acoustic output. It will be appreciated that coil arrangements according to the present invention may be manufactured for use with existing MRI or other equipment, in which case they may be suitably adapted to be sold as modular units for such existing equipment.

Coil arrangements may be arranged to generate longitudinal and/or transverse magnetic field gradients. Separate magnetic and acoustic screened coil arrangements may be provided such that gradients may be established along different axes. These axes may be orthogonal.

Coil arrangements are advantageously dimensioned and arranged such that at least a portion of an arc of a coil when placed in a magnetic field is unaffected by the field. In particular such an arrangement of nested coils may be particularly well adapted for use as an insert gradient coil.

Coil arrangements advantageously comprise a plurality of arcuate closed loops. These arcuate loops preferably subtend an angle of substantially 120°.

Although mention has been made to a closed loop arrangement, it will be appreciated that the invention is equally applicable to open loop coil arrangements, or so-called distributed coil arrangements. Such distributed coil arrangements are sometimes known as finger-print or thumb-print coils. Similarly, both open and closed loop coils may be used for magnetic gradient field generation. Both open and closed loop coils may be segmented, that is complying with Ampere's theorem, and/or both types of coil may be nested.

Ampere's circuital theorem may be envisaged, in a physical sense, as a plurality of relatively small closed loops whose total area are equal to a single, relatively larger, closed loop. As a closed loop formed by an electrical conductor may not exist exactly in one plane, it is necessary in order to calculate an effective area in a plane, orthogonal to a magnetic axis, to project the area defined within the closed loop onto the aforementioned orthogonal plane. It will be appreciated that this projected area is effectively a nominal area when a so-called open loop coil is subjected to Ampere's circuital theorem. That is to say a nominal area, defined within the region bounded by first and second pathways, is projected onto a plane which is orthogonal to the magnetic axis.

BRIEF DESCRIPTION OF THE DRAWINGS

Embodiments of various arrangements are described below, with reference to the Figures and tables of results of experiments, in which:

FIG. 17 shows a pair of arc loops (dotted lines) potted within a plastic resin;

FIG. 23(a) shows a Glass and water phantom, with and in-plane resolution 0.75 mm and an image array size 256× 256 pixels. Slice thickness 2.5 mm;

FIG. 23(b, c and d) show images of a head of a normal volunteer and show serial views of the brain with detail of the ventricles, grey and white matter and brain stem; with in-plane resolution of is 1.5 mm;

Curve A corresponds to radiated sound received in an appropriately positioned microphone when one coil in the test arrangement is-energised.

Curve B is the reduced sound level received by the microphone when both coils are energised.

The attenuation curve C is the difference of A and B.

Figure 27:
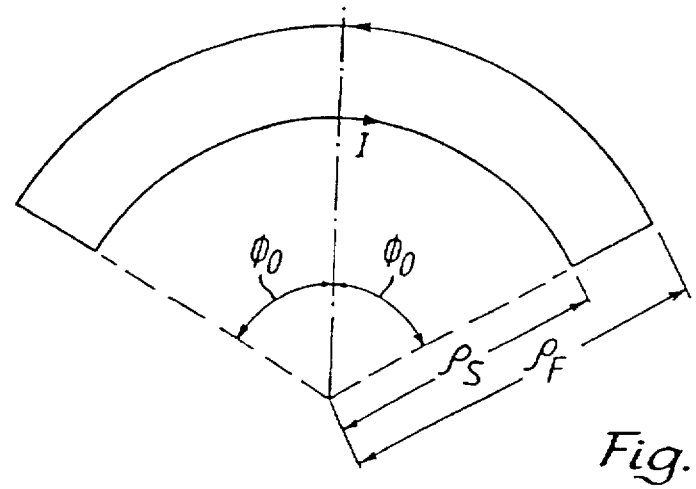
Figure 28:
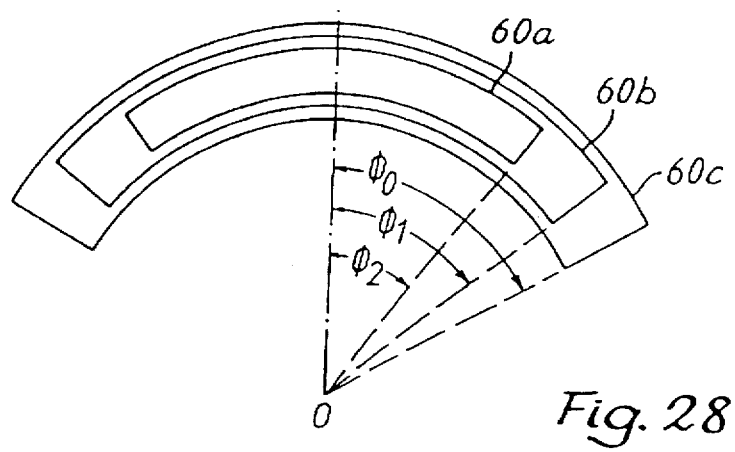
Figure 29:
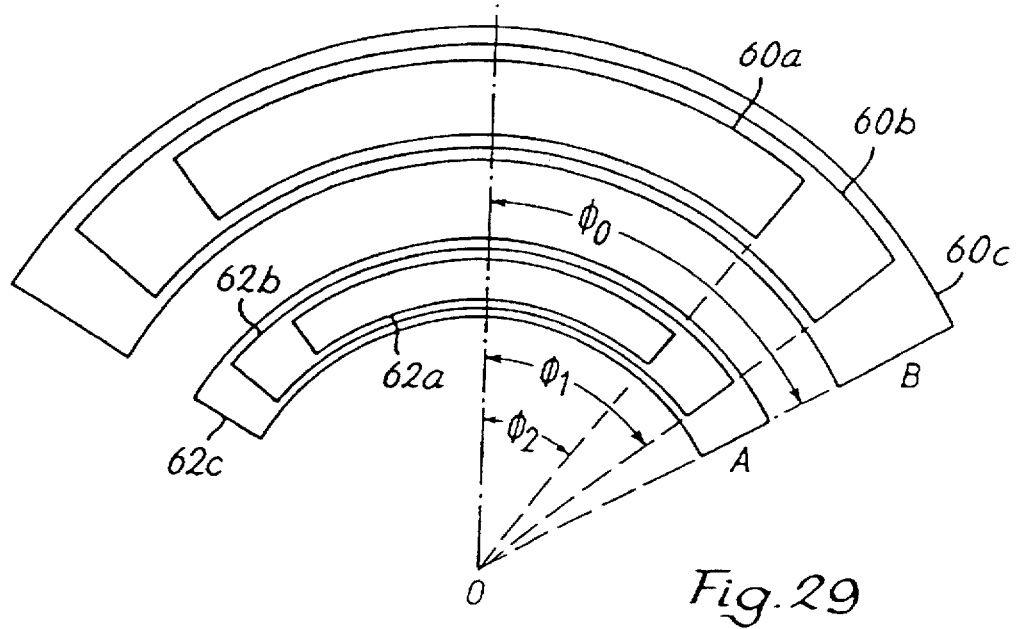
Figure 30A:
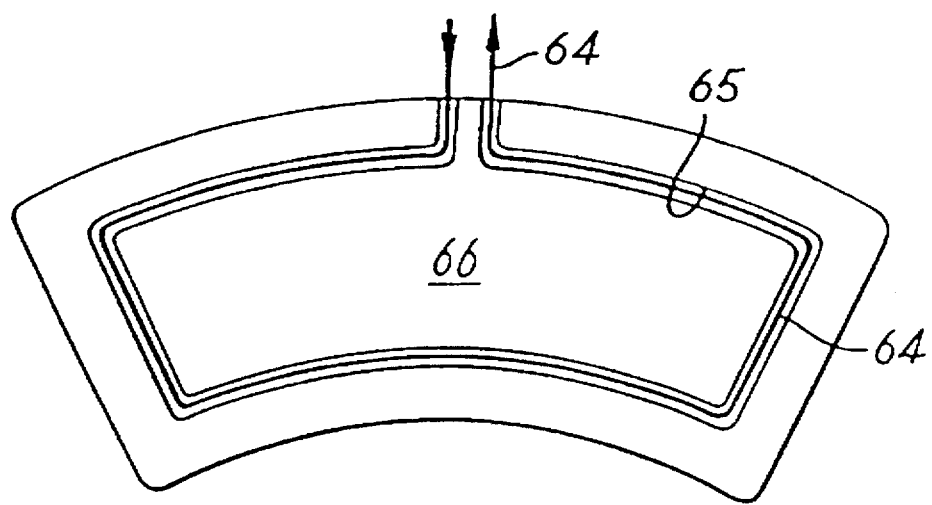
Figure 30B:
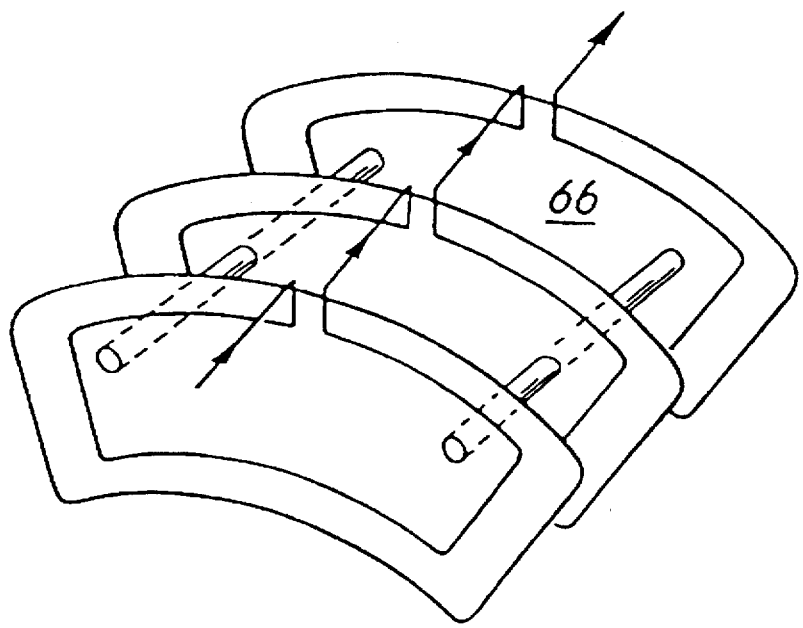
Figure 31:
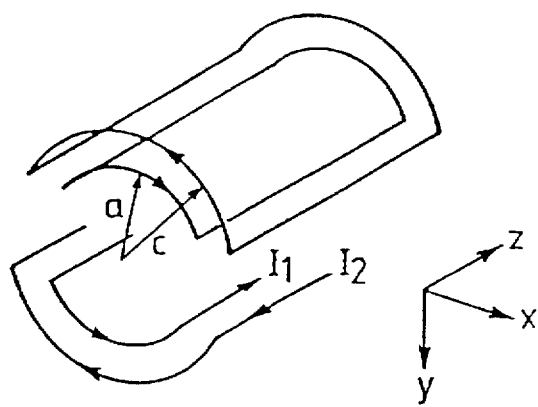
Figure 32:
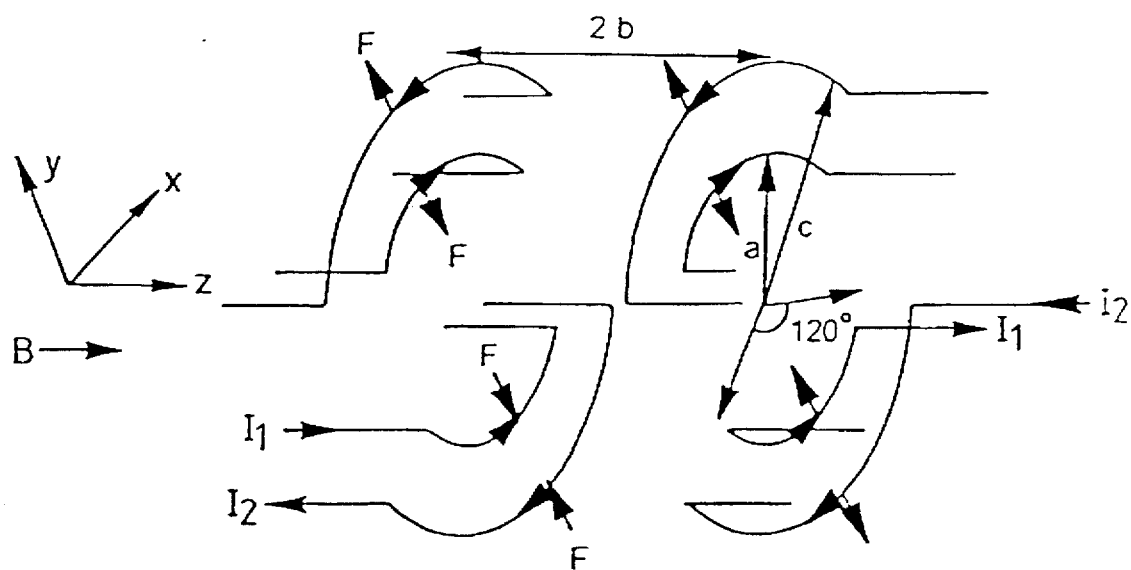

Curve D is the theoretical attenuation A, Eq. (10);

FIGS. 27 to 29 show diagrammatically arcuate closed loop configurations;

FIGS. 30 to 32 show coil windings and configurations of a different embodiment; and FIGS. 33 to 41 show different embodiments of coil windings.

DETAILED DESCRIPTION OF THE INVENTION

Figure 1:
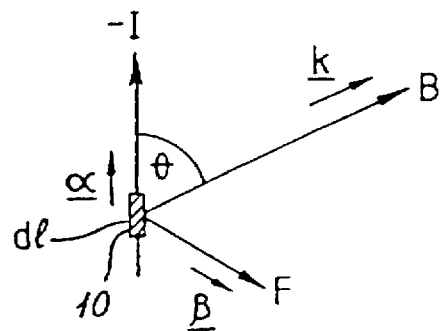
FIG. 1 shows diagrammatically a force F on a conductor line element dl carrying a current I and placed in a magnetic field B.

Referring to FIG. 1, a conductor element dl (10), carrying a current I=Iα placed in a uniform magnetic field B=Bk experiences a Lorentz force F per unit length given by $$F = -B \times I = -BI\beta \sin\theta \qquad (1)$$

where θ is the angle between the conductor and the field direction and α, β and κ are unit vectors which lie along the conductor direction, the force direction and the field direction (z-axis) respectively. When θ=0, F=0 and when θ=90°, F is a maximum.

Figure 2:
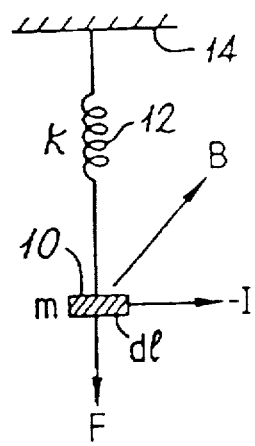
FIG. 2 shows diagrammatically a support for a conductor line element dl of mass m carrying a current I which is attached to an immoveable object, via a compressive strut represented by a spring with spring constant κ.

FIG. 2 shows an element 10 dl of conductor of mass m which is fixed via an elastic support 12 to an immoveable object 14. The elastic support 12 is represented by a spring with spring constant κ. The element of conductor 10 therefore acts as an harmonic oscillator with angular frequency ω. In a real mounting account is made of any damping; in which case the equation of motion for the system is given by:

$$F(t) = m\frac{d^2x}{dt^2} + \eta\frac{dx}{dt} + \kappa x \qquad (2)$$

where η is the damping constant.

The magnetic force on the element of conductor 10 will accelerate it into a forced vibrational mode with a general solution for the displacement x given by $$x(t) = x_o + (A_1/a)(e^{at} - 1) + (A_2/b)(e^{bt} - 1) + \quad (3)$$

$$B_1 e^{at} \int_o^t e^{-at} F(t)dt + B_2 e^{bt} \int_o^t e^{-bt} F(t)dt$$

where $$a = -\eta/2m + [(\eta^2/4m^2) - \kappa/m]^{\frac{1}{2}} \quad (3a)$$

$$b = -\eta/2m - [(\eta^2/4m^2) - \kappa/m]^{\frac{1}{2}} \quad (3b)$$

and $A_1$, $A_2$, $B_1$ and $B_2$ are constants that can be determined from the properties of the system.

In a practical coil system the mounting of a coil on an immoveable object is of course impossible. The mass of the coil former can be increased to attempt to make it immoveable, but with high static magnetic fields and the very high currents used to generate magnetic gradients in high-speed imaging techniques, the magnetic forces are so large that it is impossible to create an effectively immoveable mass.

Figure 3:
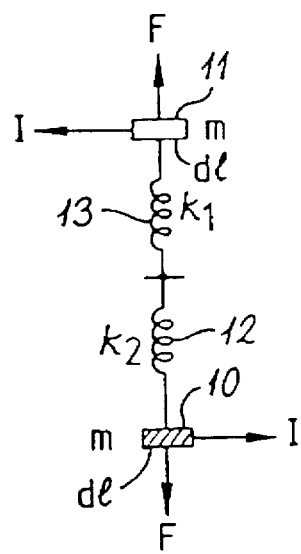
FIG. 3 shows two coupled line elements of conductor of equal masses m carrying equal and opposite currents.

FIG. 3 shows an harmonic oscillator system which comprises two oscillating masses "back-to-back" 10 and 11. In this arrangement the immoveable mount is no longer required and provided that the masses 10 and 11 are equal and spring constants κ1 and κ2 of springs 12 and 13 are equal, the arrangement of FIG. 3 keeps the centre of mass of the system constant. This mechanical model illustrates in part, the principle behind the invention of magnetic force screening as previously described.

Figure 4A:
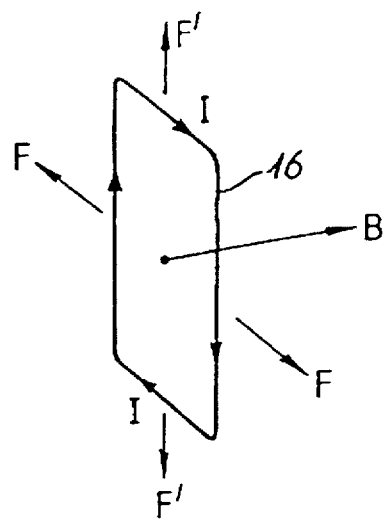
FIG. 4a shows a rectangular conductor loop carrying a current I placed in magnetic field B such that the loop plane is normal to B forces F and F' balanced.
Figure 4B:
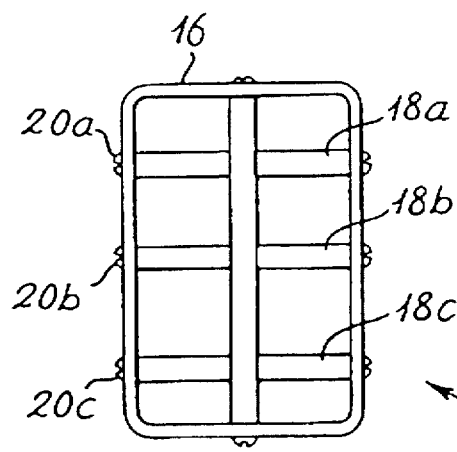
FIG. 4b shows diagrammatical representation of a rectangular current carrying loop with struts and ties to prevent movement of conductor.

Using the above magnetic force screening principles consider a rectangular loop of conductor 16 carrying a current I and placed in a magnetic field B, as is shown in FIG. 4a. Provided that the plane of the coil loop 16 is normal to the B field direction, all forces, F, F', in the conductor 16 are equal and opposite for any sense of the current I. If these forces are coupled via non-compressive struts 18 and bolts 20, as shown in FIG. 4b, all forces in the system are cancelled. In addition all moments, couples and therefore torques are cancelled. This mechanical model illustrates the principle of the present invention that is the principle of active acoustic screening or force balancing of coils.

Figure 4C:
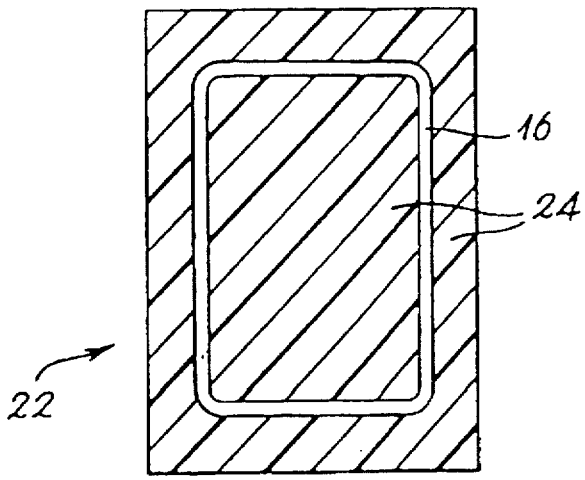
FIG. 4c shows a conductor loop potted in a polymer resin to prevent conductor movement.

If non-compressive materials are used, the conductor 16 cannot move. In this case no sound will be generated in such a coil 22 arrangement. The whole coil 22 structure can be flooded or potted with a suitable plastic resin 24 to replace individual struts by effectively a continuum of struts, as shown in FIG. 4c.

All materials are however, capable of being compressed to some extent. This means that acoustic screening as described above may have some practical limitations insofar that there will be some residual movement of the conductors. However, the invention reduces acoustic noise by an appreciable amount.

Sudden movement of the conductors will send a compressional wave through the material. The velocity of such a wave v is given by $$v = (E/\rho)^{1/2} \quad (4)$$

where E is Young's modulus and ρ is the density of the material. In order that there are no problems arising from movement of equal and opposite conductors and/or movements of conductors occurring at different instants it is also preferred that the strut length $l \leq \lambda/12$.

The velocity and wave length λ are related by $$v = f\lambda \quad (5)$$

where f is the frequency of the propagated wave. Using quoted values for E and ρ the wave velocity for a number of common materials can be evaluated. For glass v=5.0 km s$^{-1}$. For typical hardwoods v=4.5 km s$^{-1}$. For aluminium v=5.1 km s$^{-1}$ and for brass v=3.4 km s$^{-1}$. Using the velocity value for wood and taking a strut length of 0.15 m gives (from Eq. 5) a maximum frequency of f=2.0 kHz. Above this frequency progressive phase effects can be expected which in turn could lead to non-cancellation of the acoustic wave. In this regime, more traditional acoustically absorptive materials could be used in combination with active acoustic screens. The use of ear defenders is always an additional option but as stated above, is of little use in foetal scanning or in veterinary applications.

The above discussion suggests that for best effects the strut material, or synthetic plastics resin encasing, should have a large value for E and a small value for the density ρ. Such a combination will give a high compressional wave velocity. Thus, contrary to intuition, a light coupling structure of high strength is required. Loaded plastic resins in which heavy filler materials are used, may therefore be desirable since they add considerable weight to the coil arrangement and also show increased v (velocity of sound).

The principles of balanced force coils described above are applied to the design of gradient coils. This is described in detail below with reference to FIGS. 5 to 10. In the simplest arrangement a transverse gradient coil comprises four rectangular loops 26 as shown in FIGS. 5 and 6.

Figure 5:
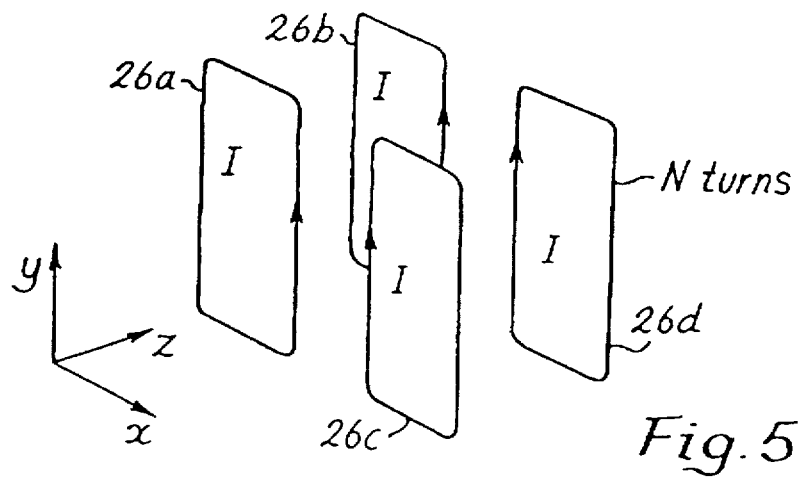
FIG. 5 is a schematic diagram showing four rectangular current loops arranged to produce a magnetic field gradient along the x-axis, all currents in the central wires have the same sense.

In FIG. 5 the loops 26 produce an x-gradient, $G_x$. In this arrangement each loop comprises N turns of conductor and the current in all arms of each loop is equal to I. In such a coil arrangement the forces and torques cancel.

Results from an experiment illustrate the efficacy of the acoutic screen as described below.

Figure 6:
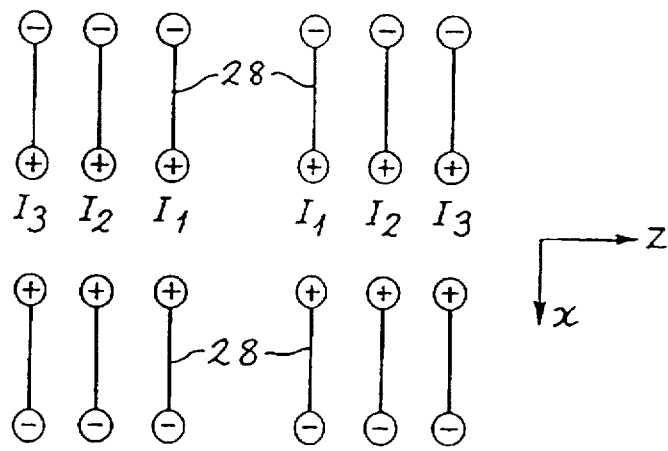
FIG. 6 is a plan view showing a set of rectangular current loops carrying currents $I_1, I_2, \ldots I_n$ arranged to approximate a distributive current array producing a magnetic field gradient along the x-axis.
Figure 7:
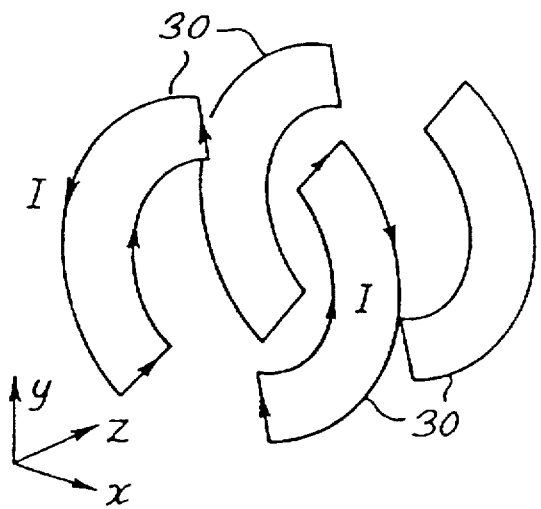
FIG. 7 shows four current loops deformed into connected arcs, each carrying a current I and arranged to produce a magnetic field gradient along the x-axis.

The arrangement in FIG. 5 can be extended to multiple loops as shown in plan view in FIG. 6, in which the currents and/or separations in progressive arcs of conductor 28 may be varied to produce a spatially more uniform magnetic field or field gradient. The spacing between parallel planes of loops may not be equal. Because most whole-body MRI imaging systems have cylindrical static magnetic field symmetry, the rectangular loops described in FIGS. 5 and 6 can be deformed into arcs 30 as shown in FIG. 7. Provided the arcs 30 form closed loops and provided the planes of the loops are normal to the magnetic field B, all torques and forces balance as in the case of a rectangular loop. This result is true for any closed loop.

Figure 8:
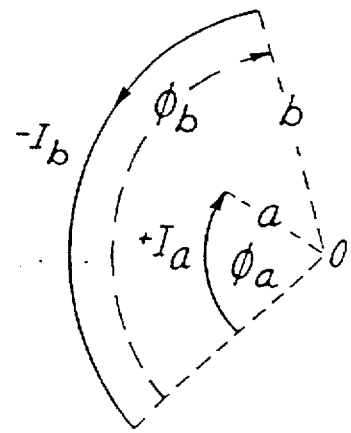
FIG. 8 shows two unconnected current arcs with common origin O and radii a and b carrying currents of +$I_a$ and –$I_b$ respectively, angular displacements $\phi_a$ and $\phi_b$ are not equal.

Consider two arcs of radii a and b with common origin 0 and with angular displacements $\phi_a$ and $\phi_b$ carrying currents $+I_a$ and $-I_b$. The arcs do not form a closed loop. The arrangement is shown in FIG. 8. In order for the forces and torques to balance in this arrangement, we require for $\phi_a = \phi_b$ that $$I_b = -\frac{a}{b} I_a = -I_a/\alpha. \quad (6)$$

Only when the two arcs are joined together to form a closed loop are the arc currents equal. It is worth pointing out that for all cylindrical gradient coil designs, the force balance principle, Eq.(6), applies only to the curved or azimuthal parts of the coil arrangement. Current components along the static $B_O$ direction (z-axis) have no Lorentz forces acting on them.

Arcs 30 in FIG. 7 may be connected in a series or a parallel arrangement or a combination of both. In all cases connections to the arcs must be achieved in such a way that feeder and connector wires or conductors are in pairs running parallel with the main magnetic field $B_O$. This parallel wire arrangement may take the form of a tight co-axial pair, a parallel bus bar pair or even a twisted pair. An advantage of a parallel bus bar is that accurate parallel strips can be spaced and bolted to prevent or reduce residual movement of the conductors. Twisted pairs are flexible and must therefore be set in epoxy or some such resin in the final wiring arrangement.

When switching coils within the close confines of a superconductive magnet the external fields arising from a gradient coil set can strongly interact with the surrounding metal structures of a cryostat. This interaction can induce eddy currents in the cryostat and in the superconductive coil itself which because of the low resistance decay away rather slowly. This effect in turn creates undesirable additional time-dependent gradients which vitiate the primary gradient quality. Active magnetic screening was introduced by Mansfield and Chapman to circumvent the eddy current problem. Mansfield P. and Chapman Mag. Res. 66, 573–576 (1986), Mansfield P. and Chapman B., J. Phys. E. 19, 540–545 (1986), Mansfield P. and Chapman B., Mag. Res. 72, 211–223 (1987). In the present situation as well as introducing active force or acoustic screens it is also desirable to have the entire gradient coil set actively magnetically screened.

Figure 9A:
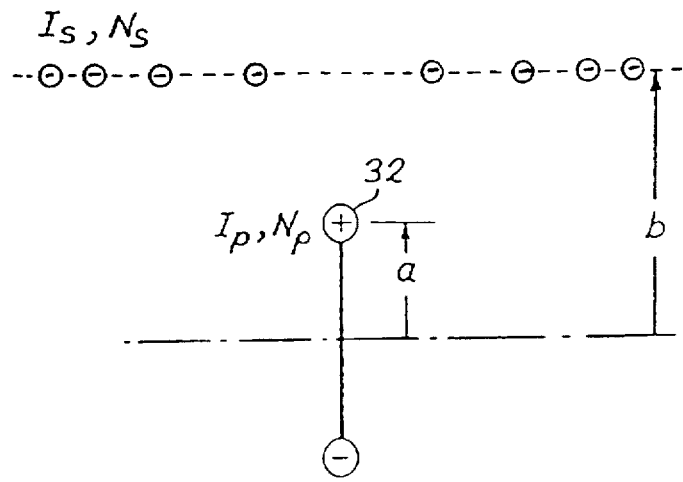
FIG. 9a is a generalised diagram of a primary coil of $N_p$ turns with radius a carrying a current $I_p$, which is actively screened with a coil of radius b with $N_s$ turns carrying a current $I_s$.

Consider, as a simple example, the case of a single hoop 32 of radius a which is magnetically screened with a screen placed on a cylinder of radius b as indicated in FIG. 9a. From the theory of active magnetic screening, mentioned above, it is known that in such an arrangement the screen current $I_s$, is related to the primary current $I_p$ by $$I_s = (N_p/N_s)[a/b]^2 I_p \qquad (7)$$

where $N_p$ and $N_s$ are the primary and screen turns respectively. However, this arrangement is not acoustically screened. An acoustic screen is required for the inner coil of radius a and a second acoustic screen for the magnetic screen of radius b. As there is a single turn on the primary coil the acoustic screen will itself be a single turn in the same plane as the primary. Let its radius be $\alpha a$, where in this case $\alpha > 1$. For an acoustic screen to be magnetically screened all that is required is that its screen be placed on a cylinder of radius $\alpha b$. That is to say the original screened coil set is expanded radially by the scaling factor $\alpha$ but its length remains the same. This is represented schematically in FIG. 9b and is generalised from a one turn primary to a distributed primary coil. If the lengths of a so called primary acoustic screen and magnetic screen acoustic screen are kept equal to the respective lengths of the coils being acoustically screened, the magnetic field screening efficacy of the acoustic screen can be compromised by changing slightly the character and strength of the screened field. This situation may be ameliorated either by modifying the field screening formula as discussed below and/or by keeping a small, thereby accepting a small radial mis-registration of the windings of the coils and their respective acoustic screens.

In the arrangement described above the acoustic screen primary and screen currents $I_{pf}$ and $I_{sf}$ are scaled according to Eq. 7. That is to say $\alpha I_{pf} = I_p$ and $\alpha I_{sf} = I_s$. The positioning of the acoustic screens is arbitrary. This being the case the coils can be arranged such that the primary acoustic screen radius coincides with the primary coil magnetic screen radius. That is to say $\alpha a = b$. In this case the magnetic screen acoustic screen radius b' is given by $$b' = \alpha b = \alpha^2 a. \qquad (8)$$

This means that for an optimally designed system in which a and b' are fixed, a is determined by the geometry. Current senses of the various coils, screens and acoustic screens follow the scheme: $+I_p, -I_{pf}, -I_s, +I_{sf}$ thus creating no current discontinuities in the case that the primary coil acoustic screen radius $\alpha a$ coincides with radius b of the primary coil magnetic screen.

For a typical whole-body gradient set, $a=65$ cm and $b'=94$ cm giving a $\alpha=1.2$. This value of a is sufficiently small so as not to change significantly the radial registration of either the primary and primary acoustic screen windings or the primary screen and its acoustic screen windings. The term "radial registration" means that the positions of conductors on the surface of an inner coil, are projected radially onto the surface of an outer coaxial cylinder, thereby defining the position of windings on this coil. The projection is done in such a way that the length of the inner winding pattern and the length of the outer winding pattern are the same. The particular embodiment described above sacrifices to some extent the magnetic screening efficacy of the gradient arrangement. However, this may be restored to some extent by maintaining the currents in the primary and its acoustic screen while varying the currents in the magnetic screen and its acoustic screen. The latter is done by keeping the ratio of screen and screen currents constant, thereby maintaining force balance.

In order to recover magnetic screening efficacy and maintain acoustic screening it is possible to consider force balancing over the entire screen surface (integrated forces) rather than detailed force balancing of individual radially registered wire pairs or sets. In this scheme, also further described later in the theoretical section, net forces and torques are zero. The magnetic screening is also greatly improved. The integration of the forces is in this case achieved by potting the three or four coils in a suitable setting resin thereby making the whole coil structure rigid.

Additional acoustic screens further reduce the screened field from its free space value $B_1$. For the system discussed the effective primary field $B_{1e}$ is given approximately by $$B_{1e} = -B_1 \left(1 - \frac{N_p}{N_s}\left[\frac{a}{b}\right]^2\right)(\alpha^2 - 1)/\alpha^2. \qquad (9)$$

Figure 9B:
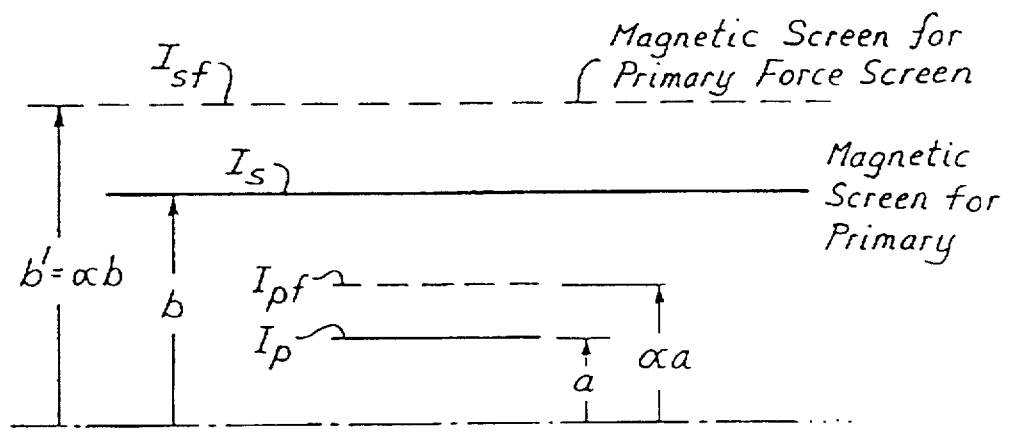
FIG. 9b shows a primary coil of radius a (solid line) actively screened by a screening coil of radius b (solid line); a further coil (dotted line) and screen (dotted line) form the acoustic screen structure.

It is clear that an arrangement of several active force or acoustically screened hoops can be constructed to create a linear gradient coil of the Maxwell type or a uniform field coil of the Helmholtz type. Cylindrical, magnetically screened (or unscreened) transverse gradient coils can also be acoustically screened using the above mentioned invention. For an actively screened transverse gradient coil a second scaled screened gradient set is interleaved with the first screened gradient coil set as described above. This arrangement is shown in FIG. 9b in which the first screened gradient set is represented schematically as solid lines. The second screened gradient set is represented by dotted lines.

Figure 10:
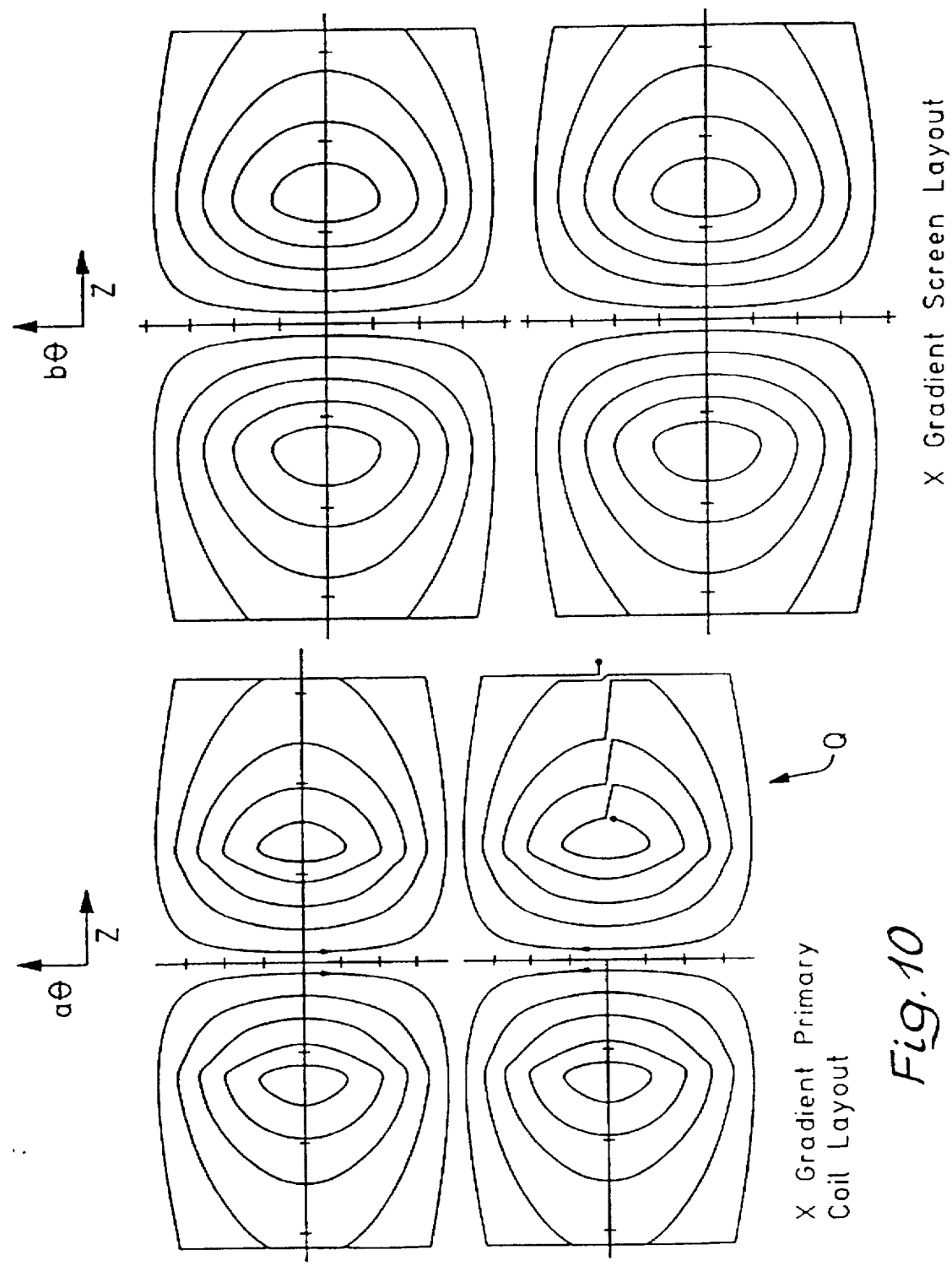
FIG. 10 is a diagram of a typical coil wiring layout for an actively screened x- or y-gradient coil system with a distributed arc arrangement giving rise to the so-called thumbprint coils.

FIG. 10 shows an example of a wire layout for an actively screened gradient coil producing a transverse gradient. The winding pattern appears as an unrolled flat or developed surface. Both primary and screen are distributed windings of the so-called fingerprint pattern. Both primary and screened wiring patterns are scaled along the $a\theta$ and $b\theta$ axes to provide acoustic screens for a screened coil arrangement.

The quadrant marked Q on the primary coil layout shows how the wire paths from one contour to the other are coupled in a series arrangement. According to the force balancing principle, the wiring layout formats of the acoustic screens for the primary and screening coils would be similar to those in FIG. 10 but expanded along the a and b axes by the factor $\alpha$.

The positioning of primary coil, acoustic screens and magnetic screens could be achieved by winding the coils on the surfaces of three or more light cylinders. To achieve proper force balance the whole structure is centered in a further containing cylinder, then flooded or potted with a suitable setting polymer resin of high elastic modulus and low density. Before the resin is allowed to set, air bubbles are removed by pumping to create a vacuum over the coil system. Polymers of high strength such as polycarbonates might be the best materials, but others like epoxy and acryllic resins and even polystyrene may be used since they will have good acoustic performance at relatively low frequencies.

The combined effects of magnetic screening and active acoustic screening could place additional demands for further current from the gradient coil drivers. The effect of reducing $B_{1e}$ lowers the inductance of the gradient coil set so that to some extent additional turns can be added to restore the inductance to its desired value. This in turn will help by increasing $B_{1e}$. However, since L varies as $N_p^2$ while $B_{1e}$ is linearly dependent on $N_p$, adding turns to restore inductance cannot fully compensate for loss of $B_{1e}$. It will therefore in general be necessary to drive the system with more current in order to achieve the desired gradient strengths. This extra current, with concomitantly larger forces may vitiate some of the acoustic reduction achieved. This is described in the experimental results below.

In a further embodiment of this invention theoretical aspects of both acoustic screening and magnetic screening are described. These lead to improvements in the efficacy of the screens.

A brief explanation of the theory now follows.

The total force exerted on a conductor of length l placed in a magnetic field is given by the Lorentz expression $$F = -I \, B \times l \quad (10)$$

In a perfectly axial field this force acts entirely in the radial plane. In the case of one system the magnetic field B =3T, l is typically of the order 0.5 m and I=200 A in copper conductor of mass 0.0765 kg/m. This results in a force of 600 N on the wire producing an acceleration of 800 g. The current is switched typically at a rate of 500 Hz, usually in a multi-mode, Mansfield P., Harvey P. R. and Coxon R. J. (1992). Meas. Sci. Technol. 2, 1051–1058, trapezoidal manner, giving rise to harmonics in the peak sensitivity range of human hearing.

In spherical harmonic arcs standard line element design theory utilises the spherical harmonic expansion of the magnetic field, in terms of Legendre polynomials ($P_{nm}$), to specify the angular lengths and positions of a series of arcs which provide the best possible approximation to the desired field at the central point of the structure, Romeo and Hoult (1984) Magnetic field profiling: Analysis and correcting, coil design. Mag. Res. in Med. Vol. 1, No. 1, 44–65. Chapman B. and Mansfield P. (1984). A simple shimming strategy for whole body MRI imaging magnets. 22nd Congress Ampere on Mag. Res. and Related Phen. Proc. 512–513. The surrounding field deviates from the ideal as one moves outwards on a spherical front towards the line elements. For MRI the most convenient structure is the surface of a cylinder, FIG. 11, for which the field expansion is given by $$dB_o = \frac{\mu_o I}{4\pi} \sin\alpha \sum_{n=0}^{\infty} \sum_{m=0}^{n} [F_{n,m-1} G_{n,m-1} + F_{n,m+1} J_{n,m+1}] r_{nm}^{np}(\cos\theta)\cos m(\phi - \psi)d\psi \quad (11)$$

where $F_{nm} = E_m(n-m+1)! P_{n+1,m}(\cos\alpha)/(n+m+1)!$
$G_{nm} = -(1+\delta_{m,o})/2f^{n+1}$
$J_{nm} = (1-\delta_{m,o})(n+m+1)(n+m)/2f^{n+1}$ and $E_m = 1$ for m=0 and 2 otherwise.

For an axial gradient, m=0, the system is anti-symmetric about the central plane. Consequently, the solution is of the form of pairs of hoops equidistant on each side of the axis carrying opposing currents. This immediately removes all even terms in the expansion. Integrating and solving for a single pair of conductors of radius a and half separation b, gives the following expansion $$B = 3\mu_o nIa^2b/(a^2+b^2)^{5/2}[rP_1(\cos\theta)+(20b^2-15a^2)r^3P_3(\cos\theta)/(a^2+b^2)^2+O(r^5)+] \quad (12)$$

Figure 12:
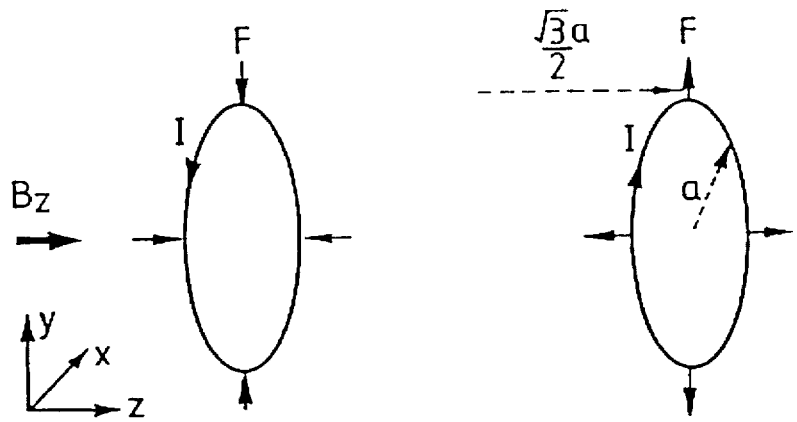
FIG. 12 is a schematic diagram showing a Maxwell coil pair which produces a linear magnetic field gradient along the axial direction, z- axis.

The optimum gradient at the centre occurs when the cubic term, $T_3$, is zero i.e. when b=(a√3)/2 in which case $$B = 0.6413\mu_o nIz/a^2 + O(r^5) \quad (13)$$

which is the standard Maxwell solution (and which is shown in FIG. 12). In the embodiment shown in FIG. 12 the Lorentz forces on each hoop arising from the $B_z$ interaction are balanced. The magnetic dipolar forces between hoops are unbalanced but these are relatively small.

Using more hoops a better solution can be found by solving for simultaneous zeros in $5^{th}$ and higher order terms, though the problem rapidly becomes extremely complicated. A better and more straight forward solution is obtained by solving the Biot-Savart equation directly for surface current distributions, Bangert V. and Mansfield P. (1982). Magnetic field gradient coils for MRI imaging. J. Phy. E.: Sci. Instrum., 15, 235–239. Mansfield P. and Chapman B. (1987). Multi-screen active magnetic screening of gradient coils in MRI. J. Mag. Res. 72, 211–223. Turner R. J. (1986). A target field approach to optimal coil design. J. Phys. D: Appl. Phys. Vol. 19, L147–L151. This method is discussed below.

Figure 11:
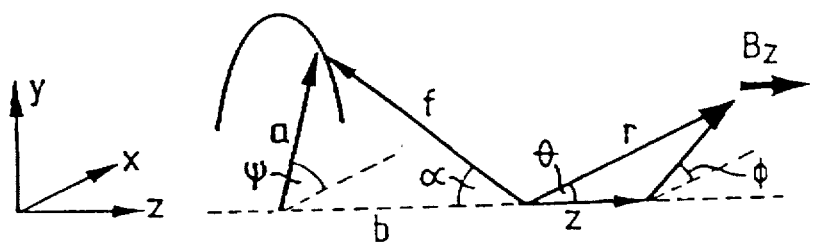
FIG. 11 is a diagram defining a cylindrical coordinate system.
Figure 13:
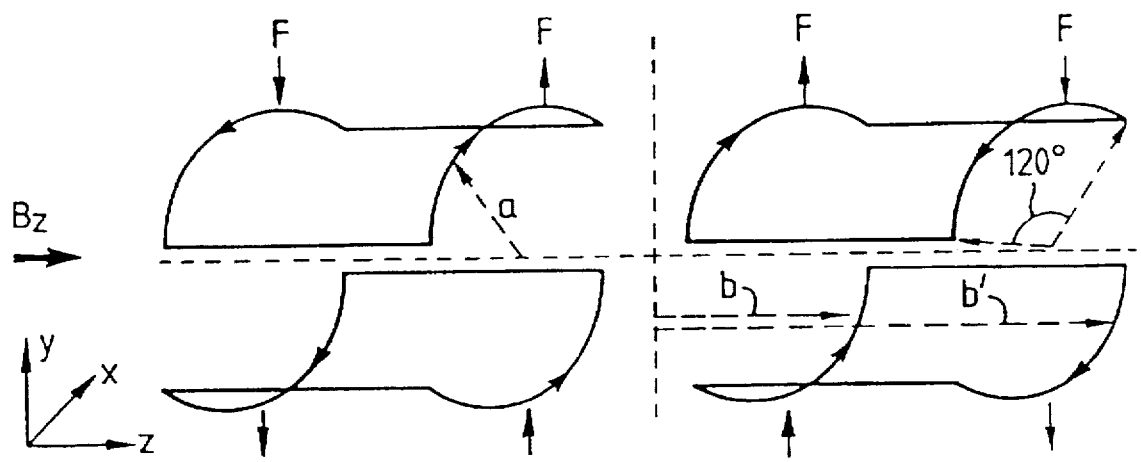
FIG. 13 is a diagram showing a simple transverse gradient coil set with four inner arcs.

Generally, by arranging that the angle subtended by the conductor $\Delta\psi = 2q\pi/m$, (as shown in FIG. 11) and where q is a positive integer and $\psi$ is the azimuthal angle, all harmonics of degree m are eliminated. Additionally, if the arcs are spaced every $\pi/m$ radians with alternate current directions, all even harmonics and all harmonics of degree less than m are eliminated. For transverse gradients, m=1, the currents must be symmetric, and 120° arcs with opposing currents 180° apart will eliminate all but $T_{11}$, $T_{13}$ etc. As in the above example of the Maxwell coil this can be readily solved, by finding the zeros of $T_{13}$, to provide the optimum ratio of separation/diameter, i.e.

$$(F(a)=a/(b^2+a^2)^{5/2}[35b^4/(b^2+a^2)^2-35b^2/(b^2+a^2)+4]=0 \quad (14)$$

which yields immediately $\tan^{-1}$ (a/b)=21.3° and 68.7°. Conveniently, the second solution provides a position for return paths as shown in FIG. 13. The existence of two solutions could be used to simultaneously eliminate $T_{15}$. However, the improvement in the field quality is likely to be small.

The forces produced on these coil structures when they are placed in an axial magnetic field are radial, the connecting sections between the arcs being parallel to, and hence unaffected by, the field. Similarly they do not contribute to the $B_z$ field. For the Maxwell coil the forces are balanced and there is no net force acting (as in FIG. 12). Consequently, for well anchored wires the acoustic noise from a Maxwell coil arises entirely from local microscopic motions arising from expansion and contraction of the whole structure. For the transverse coil the forces produce a considerable net moment along the length of the structure, as all arcs at a particular axial position act in unison in the same direction, FIG. 13. The forces on this arrangement produce a net moment along the length of the structure.

As discussed above alternative coil arrangements were proposed, wherein the return arcs are mounted at the same axial positions as the primaries. Consequently, the net forces and torques on each section are zero.

The simplest embodiment of this concept employs line element designs which have balanced forces on the coils. From analysis of the Legendre expansion, FIG. 14 and neglecting contributions from the connecting arcs, the optimum angular length is that which subtends 120°, and the optimum spacing is given by the zeros of $$F(a) - F(c) = 0 \tag{15}$$

where a, c are the radii of the primary and return arcs respectively. The arrangement in FIG. 14 ensures there are no net forces or torques on each arc loop.

There are two solutions to Eq. (15) but for reasons of efficiency the minimum separation is b. This can be obtained numerically for the optimum separation b for any given radii a and c is required. Both of these values may be chosen arbitrarily.

The field quality can be improved upon, and the effect of the radial connecting arcs taken into account, by searching the separation space about the point b. This is readily accomplished by:

(i) calculating the field at a number of lattice points over an internal region of interest (ROI), extended axially to accommodate the search space, for a single coil pair at one axial location, (ii) convoluting this with itself at a variety of locations about the point b, and (iii) searching for the minimum deviation from the ideal gradient field over the ROI. A slight further improvement is possible by allowing freedom of both angular lengths, though this introduces two additional degrees of freedom into the problem with little benefit. The problem of the radial arcs can also be tackled analytically by incorporating the exact expression for straight line arcs, Bangert V. and Mansfield P. (1982). Magnetic field gradient coils for MRI imaging. J. Phy. E.: Sci. Instrum., 15, 235–239, into the analysis.

An alternative approach is to employ surface distributed currents in the form of surface current gradient coils. For the axial gradients these can be solved conveniently using any of the standard methods. Mansfield P. and Chapman B. (1987). Multi-screen active magnetic screening of gradient coils in MRI. J. Mag. Res. 72, 211–223. Turner R. J. (1986). A target field approach to optimal coil design is described in J. Phys. D: Appl. Phys. Vol. 19, L147–L151. Chapman B., Doyle M. and Pohost G. M. (1992). Optimised electromagnetic coil design theory. IEEE proceedings Southestcon, 2, 757–762, as the net forces can be arranged to cancel in all cases. Similarly, all methods can be readily employed to accommodate active magnetic screening with or without acoustic screening of the active magnetic screen. The following analysis illustrates this for the method of Chapman, Chapman B, Doyle M. and Pohost, G. M. (1992). Optimised electromagnetic coil design theory. IEEE proceedings, Southestcon, 2, 757–762. Screened electromagnetic coils of restricted length having optimized field and method.

The fundamental Biot-Savart equation that relates current to magnetic field is a convolution and consequently is most conveniently dealt with in the Fourier domain. For a cylindrical surface of finite length the current, I, is constrained to flow in azimuthal and axial modes, Chapman B, Doyle M. and Pohost, G. M. (1992). Optimised electromagnetic coil design theory. IEEE proceedings, Southestcon, 2, 757–762. Consider an elemental unit current hoop. The permissible harmonic modes are of the form $\cos(m\theta)$, where m is an integer. The associated Fourier transform in the axial direction of the axial field at radius r, is:

$$B_a(r,k) = \Sigma m^\beta a(r,m,k) \tag{16}$$

where $$B_{a(r,m,k)} = \mu_o k a I_m'(ka) K_{m(kr)} \; r > a$$

$$\mu_o k a K_m'(ka) I_m(kr) \; r < a \tag{17}$$

Similarly, the permissible axial harmonics, $J_n$, on a cylinder of length l are given by:

$$J_n(z) = C_n H(z) \cos(2\pi n z/l + \phi) \tag{18}$$

where $C_n$ is the current amplitude of the $n^{th}$ harmonic, and $$H(z) = 1 \|z\| \le l/2 \; 0 \; \|z\| > l/2 \tag{19}$$

Fourier transformation of Eq. (18) yields $$J_n = \pi l C_n [e^{i\phi} \text{sinc}(kl/2 - n\pi) + e^{-i\phi} \text{sinc}(kl/2 + n\pi)]. \tag{20}$$

The Fourier transform of the resultant axial field is the product of the two terms Eqs. (18) and (20), given by $$B_z = \Sigma_n \Sigma_m J_n(k) B_a(r,m,k). \tag{21}$$

We are invariably interested in only one harmonic mode, i.e. for axial fields m=0, and for transverse fields m=1. The amplitudes $C_n$ can then be found by least squares fitting the fields resulting from the significant modes over the ROI in real space, as against Fourier space. Note that all design problems have thus been reduced to a one dimensional search, provided length l for the coil structure is determined a priori.

A second surface is added in order to null out the net forces. There are several ways in which this can be accomplished depending on the construction technique. Some of these are described below.

Balanced Force Loops of Fixed Angular Lengths

Figure 15:
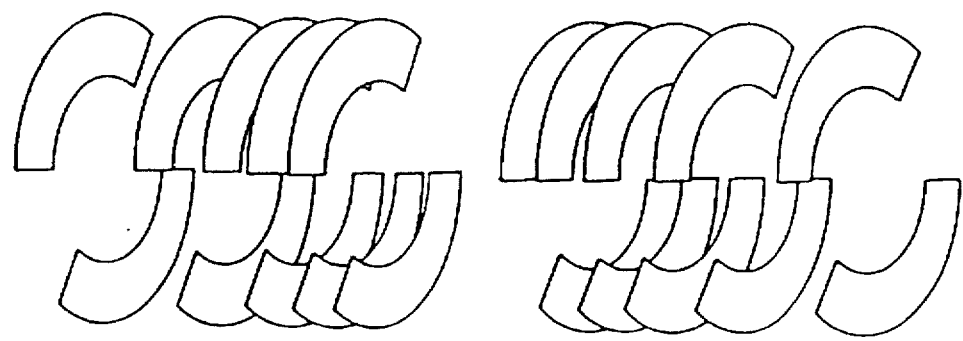
FIG. 15 shows a set of 120° arc loops as illustrated in FIG. 14 in which arc loop planes are unequally spaced along the cylindrical axis.

FIG. 15 shows a set of arc loops all with a fixed angular displacement of 120°. The position of the loops can be determined by cancelling higher Legendre terms in the spherical harmonic expansion, as outlined above. A more direct and general approach is to use these loops to approximate a continuous distribution, as follows: The field from a pair of loops at a single position is determined over an axially extended region of interest, (ROI), for example by direct numerical integration of the Biot-Savart equation $$B_1(r) = \frac{\mu_o}{4\pi} \int \frac{J(r') \times (r - r')}{|r - r'|^3} d\tau' \tag{22}$$

where bold characters represent vector quantities and $d\tau'$ is an elemental volume.

The continuous distribution is then determined for the appropriate value of m by least squares determination of $C_n$ in the expansion of $$B_z = \Sigma_n J_n(k) B_1(r,m,k) \tag{23}$$

where $B_1(r,m,k)$ is the Fourier transform of the axial component of the field from a single loop pair. The loops are then positioned so as to each require equal current. Alternatively, different currents may be supplied to each loop from a common source with an arrangement of resistors in parallel with each loop, or alternatively from a set of different current sources. This method of design has the advantage that it takes account of the connecting radial arcs.

An alternative method is to calculate the full surface current from a force balanced pair of surfaces, i.e. from Eq. (21) for a cylindrical coil, we obtain $$B_z = \Sigma_m J_n(k)[B_a(r,m,k) - B_c(r,m,k)]. \tag{24}$$

Figure 16:
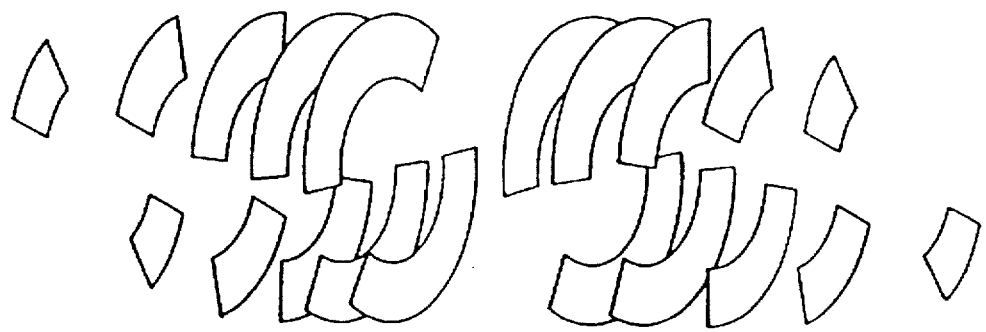
FIG. 16 is an illustration showing distributed arc loops of varying angular displacement, showing unequal plane spacing along the cylindrical axis.

The resultant arcs have varying arc lengths, FIG. 16, which can be conveniently derived by placing the arcs between adjacent equipotential contours (stream lines) of the current distributions. This provides a better solution than that resulting from Eq. (22), but as Eq. (24) does not take account of the radial arcs it depends strongly on the magnitude of their contributions.

In addition to balancing forces, which largely reduce low frequency acoustic noise, sound absorbing material can also be incorporated into the design as indicated in FIG. 17. This attenuates residual high frequency noise. The solid core couples the force balancing arc and radial connection to the primary arcs. In addition, flexible sound absorbing material (black) reduces residual high frequency noise.

Balanced Force Surface Current Distributions

Yet another approach is to use standard surface current distribution methods wherein the coils are entirely embedded in the surface. The force balance in this case is achieved by coupling the two surfaces either over their entire areas, or at strategic points. Equation (24) must then be modified to reduce the force by a scaling factor equal to the ratio of the radii to accommodate the longer lengths on the outer radius, i.e., $$B_z = \Sigma_m J_n(k) \left[ B_a(r,m,k) - \frac{a}{c} B_c(r,m,k) \right]. \tag{25}$$

For this method there are no contributions from connecting arcs as they are absent.

Active Magnetic Screens

It is a simple matter to add magnetic screening into these equations, by substituting the total screened hoop field, given by $$B_s = \mu_o k a I_m(kr)[(K'_m(ka) - K'_m(ks)) I'_m(ka)/I'_m(ks)] \tag{26}$$

for the unscreened field.

If necessary, the screen itself can also be acoustically screened. The total field components ($B_n$) are then:

$$B_n = \mu_o k I_m(kr)[J_a(k)aK_m'(ka) + J_c(k)cK_m'(kc) + J_t(k)tK_m'(kt) + J_s(k)sK_m'(ks)] \tag{27}$$

where a is the primary coil radius, c the primary coil acoustic screened radius, s that of the magnetic screen and t the magnetic screen force screen radius. The quantities in Eq. (27) are defined as follows:

$$J_c(k) = -\frac{a}{c} J_a(k), \tag{28a}$$

$$J_t(k) = \frac{a}{s} J_a(k)[\Gamma_m(ka) - \Gamma_m(kc)]/[\Gamma_m(kt) - \Gamma_m(ks)] \tag{28b}$$

and $$J_s(k) = -\frac{s}{t} J_t(k). \tag{28c}$$

By making c=t, the two acoustic screen current distributions can be superimposed. This provides a structure which is more compact, has lower resistance and is easier to manufacture.

Acoustic or Force Screens Using Geometrical Similitude

Consider the mathematical treatment for a fully screened, fully acoustic screened cylindrical gradient set in which both primary and magnetic screening, radii a, b, are force balanced with additional cylindrical coils of radii f, F. Also refer to muli-screen active magnetic screening of gradient coils in MRI. P. Mansfield and B. Chapman J. Mag. Res. 72, 211–223. Turner R. J. (1986). A target field approach to optimal coil design. J. Phys. D: Appl. Phys. Vol. 19, L147–L151, for cylindrical distributed wire coils.

Let the x-gradient coil on a cylinder of radius a be described by the stream function $S(\phi,z)$. Wirepaths are given by contours of S. The current distribution is described by $$J = -\nabla S.n \tag{29}$$

where n is the normal to the cylinder surface at any point. J has the following components.

$$J_z = \frac{1}{a} \frac{\partial S}{\partial \phi} \tag{30}$$

$$J_\phi = -\frac{\partial S}{\partial z} \tag{31}$$

The mth component in the Fourier transform of Eq. (31) is $$J_\phi^m(k) = ik\, S^m(k) \tag{32}$$

where $$J_\phi^m(k) = FT\{J_\phi(\Phi,z)\} = \tag{33}$$

$$\frac{1}{2\pi} \int_{-\infty}^{\infty} dz \int_{-\pi}^{\pi} d\Phi\, e^{-im\phi} e^{-ikz} J_\phi(\Phi,z)$$

and $$S^m(k) = FT\{S(\Phi,z)\} \tag{34}$$

For an x-gradient coil only $S^1$ and $S^{-1}$ are non-zero. The internal field is given by $$B_z = \frac{-\mu_o}{\pi} \int_{-\infty}^{\infty} ak\, ik^2 a \cos\phi\, S^1(k)\, K'_1(ka) I_1(kr). \tag{35}$$

The external field is given by $$B_z = \frac{-\mu_o}{\pi} \int_{-\infty}^{\infty} ak\, ik^2 a \cos\phi\, S^1(k)\, I'_1(ka) K_1(kr). \tag{36}$$

where r is the radial polar co-ordinate.

Acoustic screens with a 2nd coil

Add a second coil described by the stream function $S(\phi,z)$ on a cylinder of radius f. Then for force balancing we require that $$S(\Phi,z) = \frac{-a}{f} S(\Phi,z), \quad (37)$$

This ensures wirepaths have the same $z,\phi$ values on each coil and the correct ratio of currents of $1:a/f$. That is to say, the wirepaths will be radially registered.

Acoustic Screening and Active Screening

Consider four coils wound on cylindrical surfaces of radii a,b (these are primary and magnetic screen) and f, F (these are essentially primary acoustic screen and magnetic screen). FIG. 9(b) shows a general coil arrangement layout. Using the present notation, $f=\alpha a$ and $F=\alpha b$, the relevant stream functions for this arrangement are given below, as:

| radius | Stream Current Function | Function |
|---|---|---|
| a | $S_a$ | primary coil |
| f | $S_f$ | primary force screen |
| b | $S_b$ | active screen |
| F | $S_F$ | active screen force screen |

For acoustic also referred to as force screening we require that $$S_f = \frac{-a}{f} S_a \quad (38)$$

and also that $$S_F = \frac{-b}{F} S_b. \quad (39)$$

For field cancellation at radii $r>d$ we need a $I_1'(ka)S_a^1(k)+f$ $I_1'(kf)S^1_{f(k)+b/1}'(kb)S_b^1(k)$ $$+FI_1'(kF)S^1_F(k)=0 \quad (40)$$

Using Eqs. (38) and (39) applied in k-space, we find $$a[I_1'(ka)-I_1'(kf)]S^1_a(k)=-b[I_1'(kb)-I_1'(kF)]S_b^1(k). \quad (41)$$

Rearranging we get $$S_b^1(k) = -\frac{a[I_1'(kf)-I_1'(ka)]}{b[I_1'(kF)-I_1'(kb)]} S_a^1(k). \quad (42)$$

The internal field is given by $$B_z = \frac{-\mu_o}{2\pi} \int_{-\infty}^{\infty} dk\, ik^2 \cos\phi\, I_1(kr)T \quad (43)$$

where $$T = \Sigma l\, S_l^1(k)\, K_1'(kl). \quad (44)$$

and where $l=a,b,f$ and F. Using Eqs. (38) and (39) gives $$T = a\, S_a^1(k)[K_1'(ka)-K_1'(kf)] + b\, S_b^1(k)[K_1'(kb)-K_1'(kF)]. \quad (45)$$

Using Eqs. (41) and (42) gives:

$$T = S_a^1(k)T' \quad (46a)$$

$$T' = a\, \{[K_1'(ka) - K_1'(kf)] - [K_1'(kb) - K_1'(kF)] \times \quad (46b)$$

$$\frac{[I_1'(kf) - I_1'(ka)]}{I_1'(kF) - I_1'(kb)} \}.$$

The target field approach, Turner R. J. (1986). A target field approach to optimal coil design. J. Phys. D: Appl. Phys.

Vol. 19, L147–L151, may now be used in which a field $B_z(c,\phi,z)$ is specified. Fourier transforming then gives $B_z(c,k)$ at radius c. Equating the integrand of Eq. (43) to $B_zl(c,k)$ and inverting gives for $S_a^1(k)$ the expression $$S_a^1(k) = \frac{-2\pi}{\mu_0 k^2 I_1(kc)T'} B_z^1(c,k). \quad (47)$$

Full Force Screening and Active Magnetic Screening with Total Screen Current Balancing In order to design a system incorporating active and force screening with all the return arcs for each coil cylinder falling on one of the other cylinders, it is necessary that the total currents for all cylinders sum to zero. This is theoretically impossible with only three coil cylinders. However a current balanced, acoustically and actively magnetically screened coil set can be designed using current distributions on four coil cylinders.

Consider current distributions on cylinders of radii a, f, b and F ($a<f<b<F$), which are described by stream functions in Fourier space denoted by $S_a^m(k)$, $S_f^m(k)$, $S_b^m(k)$ and $S_F^m(k)$.

The three conditions which have to be fulfilled are a) for current balancing $$S_a^m + S_f^m + S_b^m + S_F^m = 0 \quad (48)$$

b) for force balancing $$aS_a^m + fS_f^m + bS_b^m + F S_F^m = 0 \quad (49)$$

c) and for active magnetic screening $$aI_m'(ka)S_a^m + fI_m'(kf)S_f^m + bI_m'(kb)S_b^m + F I_m'(kF)S_F^m = 0 \quad (50)$$

Solving these we find that the stream functions $S_b^m$, $S_f^m$ and $S_F^m$ are related to $S_a^m$ by the equations $$\frac{S_f^m}{S_a^m} = \frac{a(b-F)I_m'(ka) + b(F-a)I_m'(kb) + F(a-b)I_m'(kF)}{f(F-b)I_m'(kf) + b(f-F)I_m'(kb) + F(b-f)I_m'(kF)} \quad (51)$$

$$\frac{S_b^m}{S_a^m} = \frac{a(f-F)I_m'(ka) + f(F-a)I_m'(kf) + F(a-f)I_m'(kf)}{b(F-f)I_m'(kb) + f(b-F)I_m'(kf) + F(f-b)I_m'(kF)} \quad (52)$$

$$\frac{S_F^m}{S_a^m} = \frac{a(b-f)I_m'(ka) + b(f-a)I_m'(kb) + f(a-b)I_m'(kf)}{F(f-b)I_m'(kF) + b(F-f)I_m'(kb) + f(b-F)I_m'(kf)} \quad (53)$$

If $f \to b$ we find as expected that $S^m_F \to \infty$ indicating that there is no solution for 3 coil cylinders. Thus to make the approach work exactly requires 4 coil cylinders. However, an arrangement of 3 cylinders can be found which satisfies approximately the current value required, as described below.

Thus we can specify $B_z(c,\phi,z)$, use Eq. (47) to calculate $S_a^1(k)$, then use Eqs. (38, 39, 41 and 42) to calculate $S_f^1(k)$, $S_b^1(k)$ and $S_F^1(k)$.

Active acoustic screening may be combined with active magnetic screening to produce a coil structure with at least three cylindrical surfaces to support three coils. In order to achieve this it is necessary that force balancing occurs properly between the cylinderical surfaces. This Is achieved by ensuring that wires of all three cylinders are radially registered.

Inductance

Coils

The inductance $L_f$ of any closed flat, or approximately flat, loop is given approximately by that of the equivalent circular hoop, i.e. that of a circular hoop of the same enclosed area. In this case $$L_f = \mu_0 \left(\frac{A}{\pi}\right)^{\frac{1}{2}} n^2 \ln\left(\frac{16}{d}\left(\frac{A}{\pi}\right)^{\frac{1}{2}} - 2\right) \quad (54)$$

where A is the enclosed area, d is the thickness of the conductors in the radial direction, n is the number of turns and A is the enclosed area.

Distributed Coils

A useful approximation for distributed coils is provided by the inductance $L_s$ of a short uniform solenoid $$L_s = \mu_0 n^2 \frac{A}{l} E \quad (55)$$

where l is the length of the structure, A is the mean cross sectional area and E is an end correction factor given in Table 1 showing correction factors for surface current distributions The general equation for inductance is $$L_{pq} = -\mu_0 \pi^2 pq/(D_p D_q) \sum_m \int J_p(-k, -m) J_q(k, m) I_m'(kp) K_m'(kq) dk \quad (56)$$

where p and q are the radii of the two surfaces on which current distributions $J_p$ and $J_q$ flow respectively and $D_p$ and $D_q$ are their respective magnitudes.

Results

1. Discrete Arc Loop Design

Figure 14:
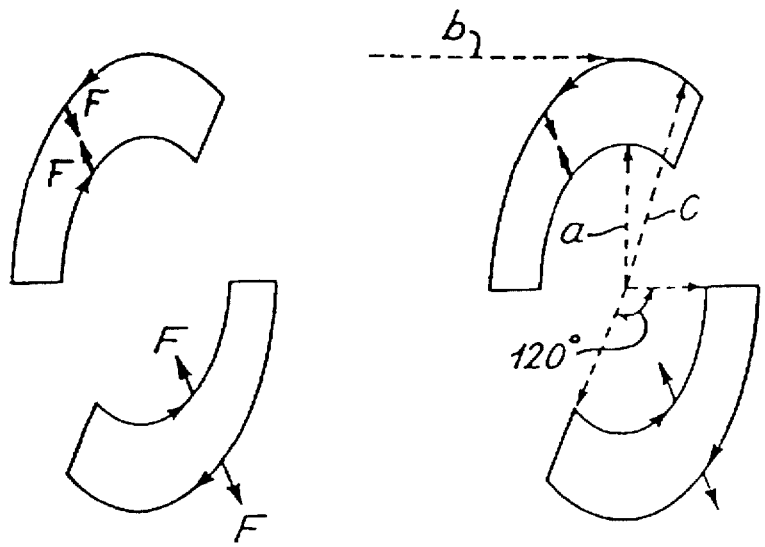
FIG. 14 shows a transverse gradient set comprising four inner arcs with co-planar return arcs.

This design, FIG. 14, was implemented for the construction of an insert gradient coil for use with EPI in the 3T whole body MR system, currently in use at the MR Centre of the University of Nottingham. The coil arrangement was potted in a calcium carbonate loaded polystyrene resin and incorporates the x,y and z gradient coils.

Practical constraints of size, access, available power supplies and above all manufacturing capabilities resulted in the design the details of which are given in Table 2.

This is a magnetically unscreened system for which the external field, at a radius of 50 cm is:

a) for the Maxwell coil; $2.4 \times 10^{-7}$ T/Amp-turn (at approximately $z=\pm 20$ cm), b) for the transverse gradients; $3.6 \times 10^{-7}$ T/Amp-turn (at $z=0$ cm). These are the worst points and are within acceptable limits.

Figure 23A:
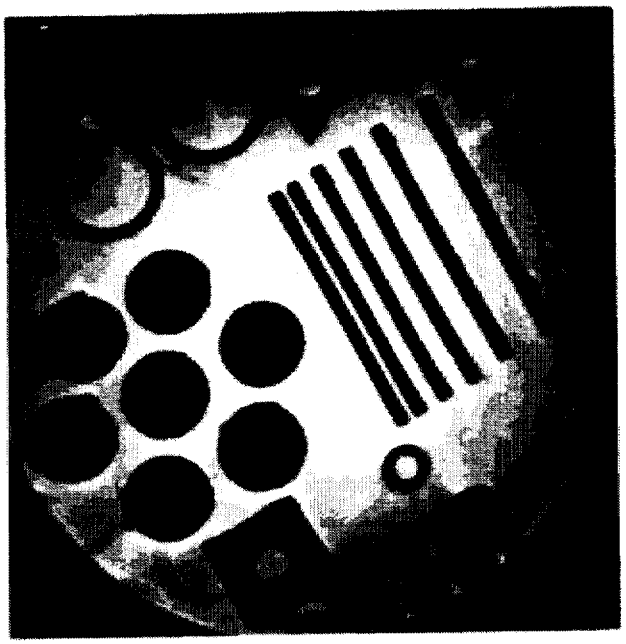
FIGS. 23(a) to (d) show echo-planar "snap shot" images obtained at 3.0 Tesla T with the quiet gradient set described in FIGS. 7, 12, 14 and 17 with the parameters given in Table 2.
Figure 23B:
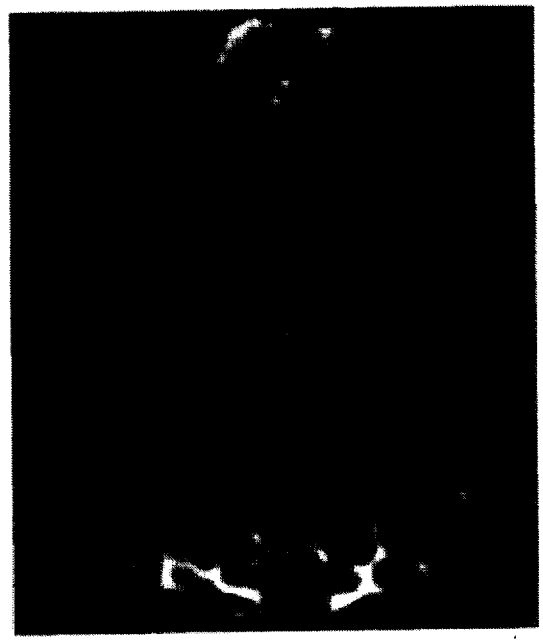
Figure 23C:
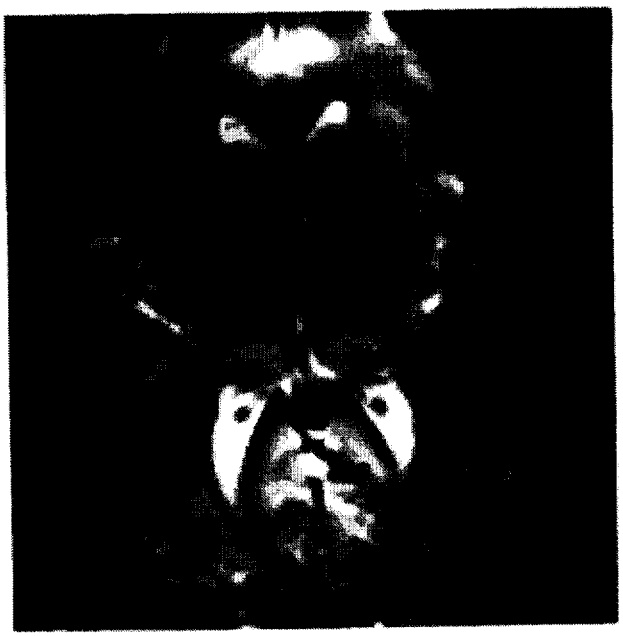
Figure 23D:

Significant acoustic noise reduction with this design has allowed EPI results to be obtained in phantoms and on heads of volunteers at 3.0 T. Some of the first results are shown in FIG. 23b, c and d.

Transaxial snap-shots showing serial views of the brain with detail of the ventricles, grey and white matter and brain stem. (a) Glass and water phantom. In-plane resolution 0.75 mm. Image array size 256×256 pixels. Slice thickness 2.5 mm. (b, c and d) Head images of a normal volunteer. The in-plane resolution of these images is 1.5 mm. Image array size 128×128 pixels. Slice thickness 5 mm. All images are single snap-shots and were each obtained in approximately 140 ms. The coil parameters are given in Table 2.

Theoretical designs have also been produced for transverse gradient sets employing: 2. Distributed Arc Loops of Constant (120°) Angular Length; 3. Distributed Arc Loops of Varying Angular Length; 4. Balanced Force Surface Current Distributions; 5. Fully Force Balanced Screened Surface Current Distributions, and 6. Fully Force Balanced Screened Surface Current Distributions, Utilising the Force Screen for return paths.

For the purpose of comparison these designs were restricted to the dimensions of the coil set produced using discrete arc loops described above. These are 40 cm in length and 40 cm in diameter with the ROI defined as a central cylindrical region of length and diameter 20 cm. For this reason the method of optimisation for coils of restricted length of the primary, Turner R. J. (1986). A target field approach to optimal coil design. J. Phys. D: Appl. Phys. Vol. 19, L147–L151, were employed. The optimisation being performed on a lattice of points that spanned one representative quadrant of the plane of maximum gradient (r=0, 2, . . . 10 cm; z=0, 0.2, . . . 10 cm).

Distributed Arc Loops of Constant (120°) Angular Length

Figure 18:
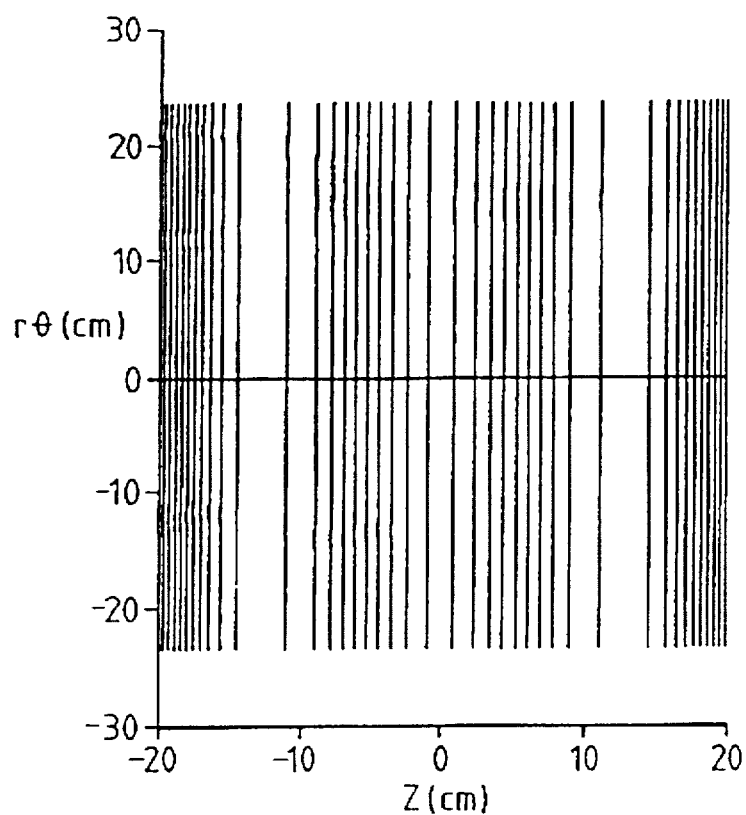
FIG. 18 shows positions of a number of distributed discrete 120° arc loops in a quiet x- or y-gradient coil design.

The field from a single pair of elemental arc loops at z=0 was determined over extended axial ranges. These were then convoluted with successive axial current harmonics. The least squares fitting of the resultant fields over the ROI resulted in an optimum current distribution comprising of the first four axial harmonics. The resultant (20) loop positions are shown in FIG. 18.

Distributed Arc Loops of Varying Angular Length

Figure 19:
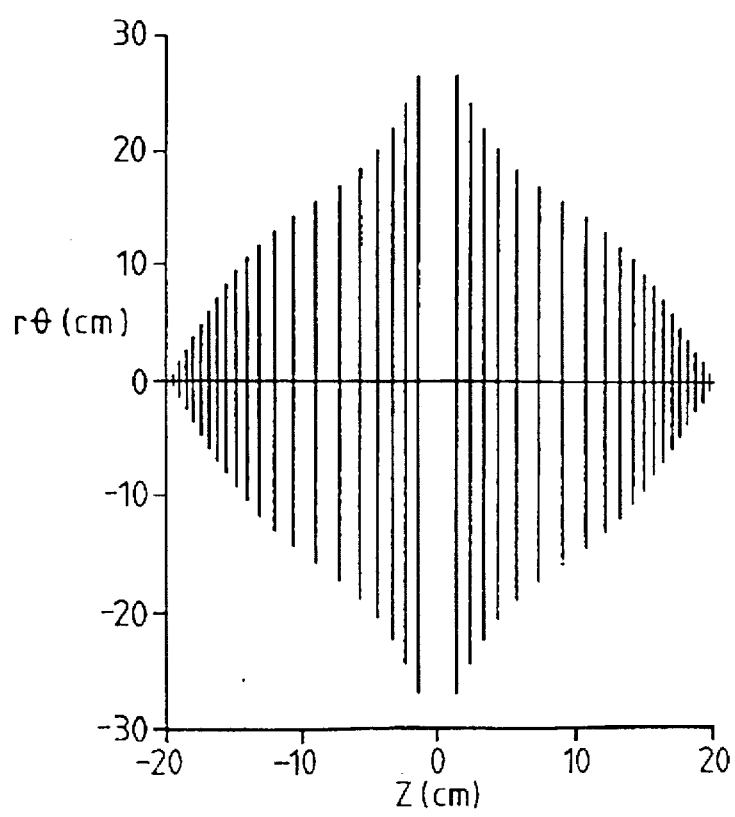
FIG. 19 shows diagramatically positions of a number of distributed discrete arc loops or various arc angular displacements in a quiet x- or y-gradient design.

Using Eq. 24, and ignoring the contributions of the connecting arcs, least squares optimisation resulted in a solution with 4 coefficients (0–3). The resultant (20) loop positions are shown in FIG. 19. The lengths were determined by positioning the arcs between equipotential streamlines.

Balanced Force Surface Current Distributions

This particular design paradigm is not suited to a restricted primary surface. Consequently, the design that resulted from employing Eq. 25 is not especially efficacious in this particular case. A practical embodiment of this design with length restriction is only possible over a region of interest of the order of 10 cm in length where it is less efficacious than the discrete arc loop method.

Fully Force Balanced Screened Surface Current Distributions

Because of the requirement of current return paths a longer whole body system was designed where the length restriction of the primary could be relaxed somewhat. The coil dimensions were chosen with practical considerations in mind. Typically these are patient access and power supply limitations. The dimensions are:

1. primary radius (a) 30 cm,
2. primary length 120 cm (2×diameter)
3. screen radius (s) 5 cm (1.5×a)
4. cylindrical ROI of 20 cm radius (66% a) and 40 cm length. The force screens for both primary and magnetic screen were made coincident and the single resultant current distribution determined. The individual current distributions and therefore, wire paths, are provided simply by radial scaling of the primary and magnetic screen distributions respectively in the azimuthal direction.

The radius of the force screen surface was chosen to maximise the gradient efficiency. This was achieved by minimisation of the self inductance for the first current harmonic. This resulted in an optimum radius of 39.75 cm. Full least squares optimisation of the gradient field from Eqs. (27) and (28), was performed for radii in this region, resulting in an optimum at 38 cm. Table 5. The resultant surface coil distributions for one quadrant of the primary, combined force screen and magnetic screen are given in FIGS. (20a), (20b) and (20c) respectively.

The required currents in each surface are given in Table 3.

Figure 21:
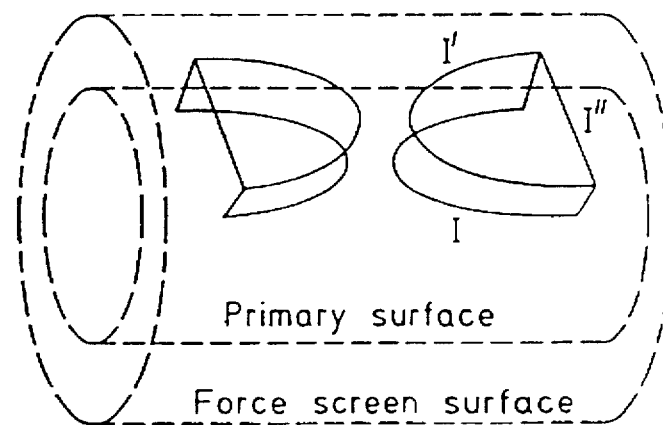
FIG. 21 shows a single turn illustration of a acoustic screened embodiment in which the acoustic screen is utilised as the return paths for the primary gradient coil. (The acoustic screen can also be used to provide return paths for the magnetic screen)

Fully Force Balanced Screened Surface Current Distributions, Utilising the Force Screen for Return Paths In the above embodiments the integral of the current distributions on each surface are zero. From Table 3 the total current flowing in the force screen is almost the sum of the other two. This is true generally and provides for the possibility depicted in FIG. 21, wherein the force screen is utilised for the return paths of the other two coils. The remaining imbalance in current is required at the positions of the connecting arcs to balance the radial forces from these arcs. It is a simple matter to prove geometrically that the forces do exactly balance when Kirchoff's law is satisfied. This is immediately apparent by considering the projections on the r-θ plane (I=I'+I", in FIG. 21).

As stated above, the additional constraint for complete current balance, force balance and magnetic screening is that at least 4 surfaces are required on which 4 separate coils are wound to achieve the required simultaneous conditions of Eqs. (48–50), anything different to this requires compromise of either screening or force balancing or in current balance. The latter may be achieved in the first instance approximately, then by introducing additional low current pathways to take up any slack producing imbalance.

Comparison of the Designs

Table 4 below contains a comparison of field quality, efficiency and inductance for these various designs.

Discrete Arc Loop Design

The resultant coils are extremely compact axially. This makes them particularly suitable for insert gradient coils. They are also relatively easy to construct and can be readily incorporated into structures with further acoustic noise reduction features (such as that arrangement depicted in FIG. 17).

Distributed Arc Loops of Constant (120°) Angular Length

These coils are also compact yet are capable of providing gradient fields over regions of greater axial extent. Consequently they are also suitable for the design of insert gradient coils.

Distributed Arc Loops of Varying Angular Length

These embodiments have similar properties to those of the constant angular length in that they provide gradient fields over large fractions of the axial extent of the coil. They are consequently highly suited for the design of insert gradient coils.

It is possible to optimise the efficiency of the design by varying the radial separation.

Balanced Force Surface Current Distributions

For transverse gradients these coils generally require more axial length than the above loop designs to accommodate the return paths on each individual surface. These are particularly suitable for standard gradient coil designs which permit access of an entire body.

This unscreened example resulted in an inefficient design. This arose from the fact that the current return paths for the primary and force screen were individually constrained to their surfaces respectively.

When magnetically screened this design improves in efficiency by virtue of the additional field provided by the screen.

All these designs can be magnetically screened and this screening can itself incorporate a second force screen, which can be coincident with the primary force screen.

Fully Force Balanced Screened Surface Current Distributions

The addition of the magnetic screen serves to both improve the extent of the utilisable field and improve the efficiency. The force screen surface has a secondary effect in that it partially screens the primary's magnetic field. As the current ratio is higher (a/b) than that required for magnetic screening ((a/b)$^2$) the force screen surface over compensates for the primary's external field. Therefore the magnetic screen current compensates primarily for the external field of the force screen and adds to the primary field over the ROI.

For maximum efficiency the magnetic screen and force screen surfaces should be as far away from the primary as possible. The radius of the screen is usually limited by the free bore of the MRI system. Other physical limitations must be employed to determine the optimum positioning of the force balancing surface, e.g. the maximum current carrying capacity of the conductors. For example, the axial length of the magnetic screen and combined force screen surface over which the current can flow is greater than that available to the primary (usually of the order of two times). It may therefore be convenient to have twice the number of turns carrying the same current as the primary. Alternatives are to position the force screen surface to provide either the minimum total inductance or maximum efficiency.

For a normal magnetically screened coil, the total inductance of the system is just the sum of the inductance of the primary and the mutual inductance of the screen.

If a force screen is introduced and its position is chosen such that its self inductance is zero, mutual inductances with the other surfaces can be expected to be negligible. Consequently, the overall inductance, L, will be comparable to that of the normal screened case. This in turn results in the maximum efficiency, where efficiency (n) is defined as $$\eta = \frac{1}{\sqrt{LI}} \quad (57)$$

where I is the current per unit gradient.

Whole Body Coils.

This design provides a gradient field of 1.2 µT/m per amp-turn. In comparison, a similarly optimised screened coil provides 2.6 µT/m per amp-turn. The fully force balanced screened coil does require significantly more current in the screen, though this can be easily accommodated with additional screen turns without any inductance penalty.

Displacing the force screen surface from this optimum position towards either the primary or the magnetic screen surface results in an asymptotic increase of the current in both it and that surface.

Fully Force Balanced Screened Surface Current Distributions.

Utilising the Force Screen for Return Paths

Figure 22C:
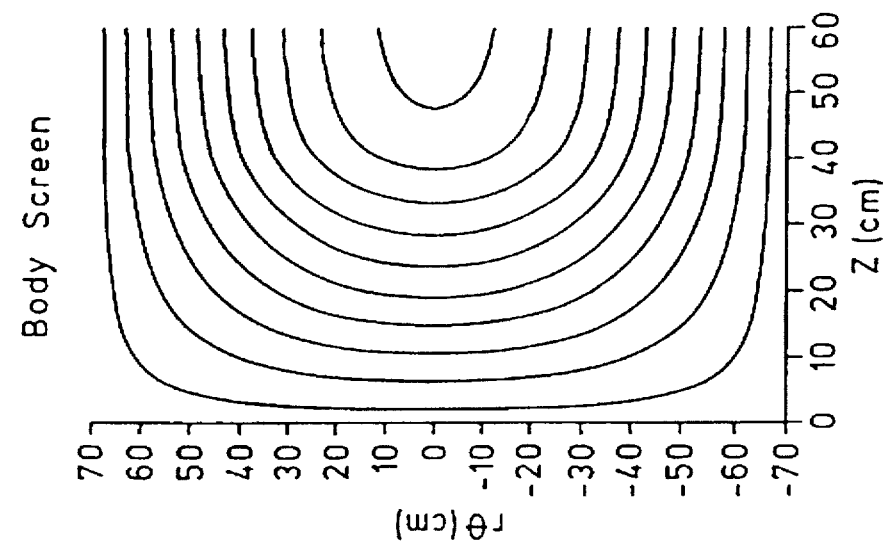
FIG. 22 is a diagram showing the wire paths for one quadrant of another distributed whole body quiet gradient coil design which utilizes the acoustic screen for the current return paths, (see FIG. 21). (a) wire positions for the primary coil, (b) wire positions for the combined primary/magnetic screen acoustic screen and (c) wire positions for the active magnetic screen.
Figure 22B:
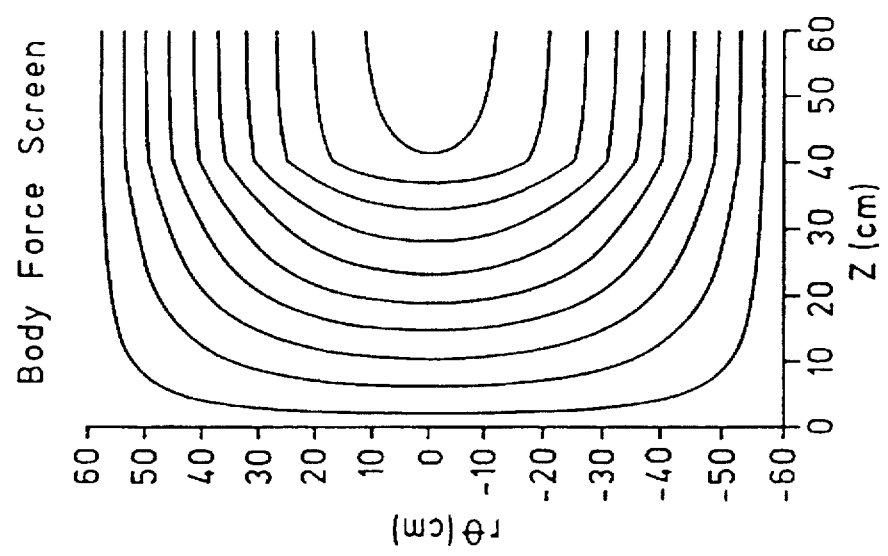
Figure 22A:
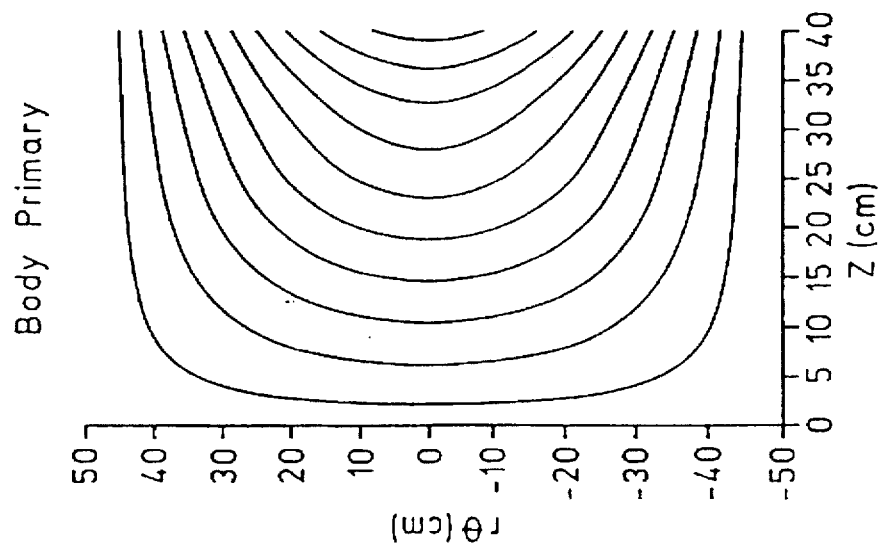

FIGS. 22(a), 22(b) and 22(c) show the primary, force screen and magnetic screen wire distributions for this design, with parameters given in Table 5 below. The absence of return paths renders this particularly suitable for making short coils. This combined with the geometry of the structure considerably reduces the inductance of the system making it a highly efficient option. In this determination the effect of the connections and the requisite additional return paths for the force screen current (all of which are small) are ignored. All of these features can be incorporated into the design if required.

Stated above under "Full force screening and active magnetic screening with total screen current balancing," in general 4 cylinders are required for exact solution to Eqs. (48–50). In the example given in this section only 3 cylinders are used which means that for perfect current balance, the magnetic screening efficacy suffers, or alternatively if magnetic screening is perfect, force balance is sacrificed.

The same principle of force cancellation can be applied to connecting wires. The wires conducting current in and out should be located as close together as possible so that the magnetic field contribution is negligible. The net force for such an arrangement is automatically zero, but the forces can be significant on the small scale. The three options are, twisted pairs, parallel conductors or coaxial cable. Twisted pairs produce little extraneous field but allow considerable movement. In addition, there is no orientation in which the force is zero. A twisted pair can be considered as a pair of interlaced coils. Consequently, aligning the main axis of the pair with the magnetic field still leaves an effective coil component in the worst orientation.

For parallel wires, each has absolutely zero force when aligned parallel to the magnetic field only, but the forces on each, though balanced can be considerable in other orientations. Additionally, there is a net, albeit small, magnetic dipole.

Coaxial cable provides the optimum as it has no magnetic field, i.e. is perfectly self screening and though the forces are orientation dependent the nesting of one conductor inside another optimally distributes the forces between the two; the net force is of course also zero. Standard coaxial cables are designed for high voltage and low current. Conversely, MR requirements are, high current, and moderate voltage. Consequently, we constructed our own high current, low resistance conductor by nesting 12 AWG striated cable in 6.35 mm copper tubing. The whole arrangement was then rolled flat to lock the wires in place and placed within flexible plastic tubing for insulation (Portex 7 mm×10.5 mm).

One strategy for the reduction of the high frequency acoustic noise is to encapsulate the coupled balanced force pairs in absorbent material. An example of this for the spherical harmonic arc loops is shown in FIG. 17.

Even the magnetically unscreened designs are partially self screening as the fields from the primaries and the force screens cancel to a degree. When the length of the primaries are severely restricted, as in the case of insert coils, the use of arc loop designs have considerable advantages. When this is not the case the greater ease of manufacture and the better field quality available from the adoption of surface distributed coils makes these the better choice. As always the available space and total coil inductance must also be taken into account before the final decision on which particular embodiment to implement for a particular application.

Considerable reduction in the acoustic noise is possible with the adoption of force screened designs, which will prove of increasing benefit in higher field systems and with increased gradient strengths and switching rates. These designs do not carry any unreasonable overheads in terms of reduced efficiency over conventional screened coils.

Other design optimisation methodologies, J. H. Carlson, K. A. Derby, K. C. Hawryszko and M. Weideman (1992). Design and evaluation of screened gradient coils. Mag. Res. Med. 26, 191–206, such as minimisation of total inductance, maximisation of efficiency, etc. are completely compatible with the use of acoustic noise reducing force screens.

Distributed arc loop designs provide homogeneity over greater fractions of their length than conventional designs, making them ideal for use as insert gradients. Along with their high efficiency, this makes them particularly suitably for use with highly demanding MR imaging techniques such as FLASH, and EPI. In addition to total force balancing, arc loop designs also provide complete torque cancellation. The arc loop designs are such that the axial component of the field are one or two orders of magnitude greater than the two transverse components. This is in contrast to conventional transverse gradients were the axial component is smaller than one of the transverse components. This makes this design intrinsically safer regarding the level of gradient field applied to the subject.

Distributed surface designs are intrinsically easier to manufacture. While they do not provide complete torque cancellation, as do arc loop designs, the small residual torques act over small azimuthal distances. This contrasts with conventional designs which produce large torques which act over each half of the axial length as shown in FIG. 13.

All designs can be readily modified to be magnetically actively screened.

The principles of active force screened coils have been described and it is shown that such an approach can tackle the fundamental cause of noise generation in magnetically screened and unscreened gradient coils used for MRI. Although the primary objective in this approach is the generation of quiet gradient coils, which are safe and unobtrusive for patient and animal use, force screened coils could also be of value in situations where coil movement may be a problem. Such a situation exists in MRI microscopy where very high spatial resolution images are required. Small movements of the gradient coil structures could well result in vitiating and/or limiting the ultimate resolution achievable.

Figure 24A:
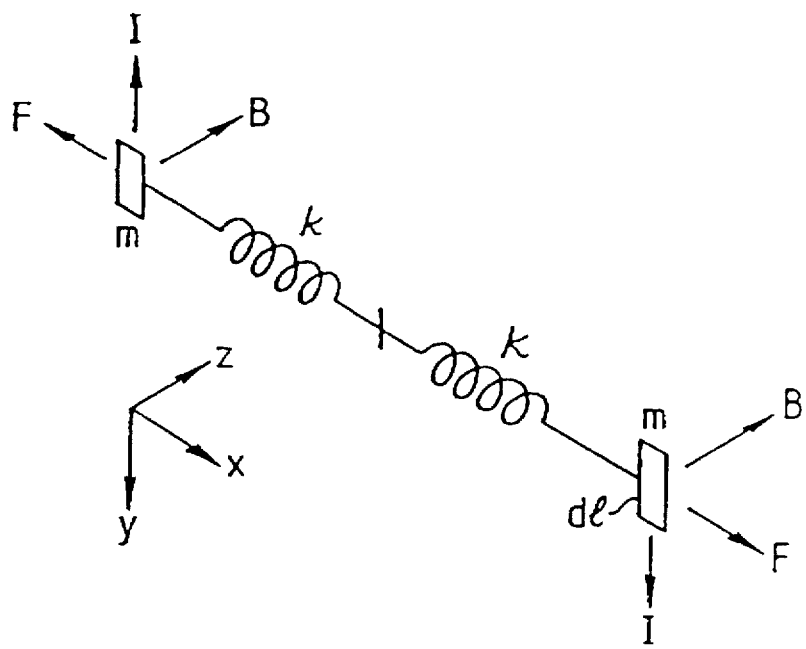
FIG. 24a is a diagram of a spring mass mechanical equivalent to FIG. 24b wherein the centre of mass of the system remains fixed if the spring constants are equal.

Further test results are described below with reference to FIGS. 24 to 26 inclusive and equations 58 to 63.

From the above discussion it is clear that for best effects the strut material or plastic resin encasing should have a large value for E and a small value for the density $\rho$. Such a combination will give a high compressional wave velocity. Thus contrary to intuition a light coupling structure of high strength could serve as well as a heavier material; the crucial factor in either case being a high wave velocity. Loaded plastic resins in which heavy filler materials are used can add considerable weight to the coil arrangement and also show extra strength.

Figure 24B:
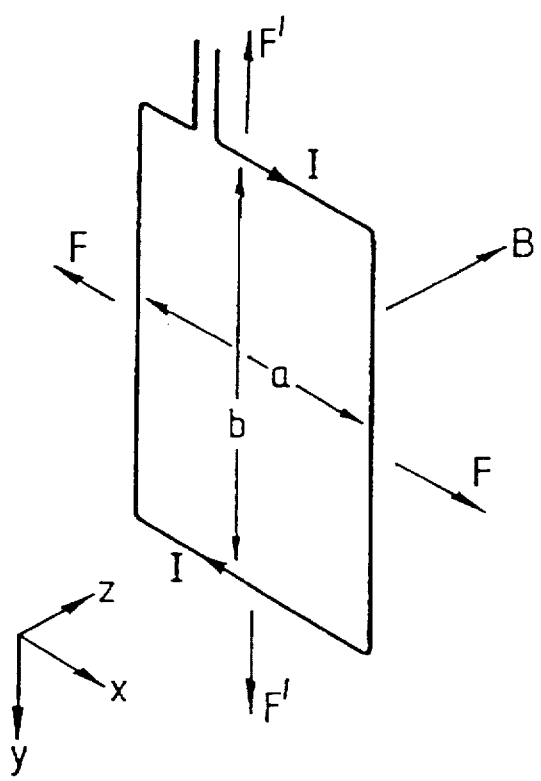
FIG. 24b shows a rectangular conductor loop carrying a current I placed in magnetic field B such that the loop plane is normal to B.

The principles of balanced force coils can be immediately applied to the design of gradient coils. In the simplest arrangement a transverse gradient coil FIG. 5 can be designed from four or more rectangular loops one of which is indicated in FIG. 24b to produce an x gradient, $G_x$. For purer gradients a gradient coil can be constructed from n quartets of loops as shown in plan view in FIG. 25a. In this arrangement each quartet of loops has a width $a_1$, length $b_n$ and comprises $N_n$ turns of conductor. Current in successive quartets of loops is equal to $I_n$. The plane separation for the nth quartet is $2z_n$ and the in-plane loop displacement is $a_n+x_n$. In such a coil arrangement the forces and torques cancel. A spatially more uniform magnetic field or field gradient is achieved with n>1.

Because most whole-body imaging systems use cylindrical static magnetic field symmetry, the rectangular loops described can be deformed into arcs. Provided the arcs form closed loops, the planes of the loops are normal to the magnetic field B, and provided the coil wires are mechanically coupled by struts or by potting in a resin, all torques and forces balance just as in the case of a rectangular loop. This result is true for any closed loop carrying a current I which is confined to a plane and where $\theta=90°$, since the line integral around the loop is:

$$\oint dF = 0. \tag{58}$$

This result can be generalised to line integrals where the current in the loop varies, i.e., $$\sum_i \int_i dF_i = -\sum_i \int_i B \times I_i dl = 0 \tag{59}$$

where $I_i$ is the current flowing in the ith segment of the contour. In this form force balance is also achievable with open current loops.

Arc loops may be connected in either a series or a parallel arrangement or a combination of both. In all cases the connections to the arcs must be made in such a way that the feeder and connector wires or conductors are in pairs running parallel with the main magnetic field B and are preferably set in a plastic resin in the final wiring arrangement.

In the particular test arrangement now described, two flat rectangular coils 50 and 51 were constructed with 10 turns of wire each, with coil dimensions a=40 cm and b=40 cm. The two coils were mounted coaxially with their planes parallel to B and spaced 7.5 cm apart. The arrangement is shown in plan view in FIG. 25b. Connections were such that either one or both coils (corresponding respectively to an acoustically unscreened and acoustically screened arrangement) could be driven from a current source (not shown). The two shaded regions of FIG. 25b were potted in solid polystyrene 52 so as to encase wires 50 and 51 carrying opposite currents. Shading indicates mechanical coupling between coils created by potting in resin. Currents in each coil are equal and opposite. Currents in conductors parallel with B produce no forces. This arrangement is therefore an example of an open current loop where the return currents are zero in the x-y plane. Since the coil length b is greater than the plane spacing, x, compressive/expansive displacements of the two wires 50 and 51, (one from each coil) are considered to be equal and opposite. For simplicity, each wire 50 and 51 is assumed to launch a plane acoustic wave in the solid. The waves give rise in the screened case to a net transverse acoustic source amplitude $A_1$ at the wire positions given by:

$$A_1' = \pm A_1 e^{2\pi f t}(e^{ikx}e^{-\alpha x}-1) \tag{60}$$

where $A_1$, is the initial wave amplitude at each wire position, f is the applied frequency of the current pulse in the coil, k is the wave propagation constant in the polystyrene block given by $$k=2\pi f/v \tag{61}$$

and $\alpha$ is the wave attenuation per unit length. As a simplification take $\alpha=0$. Assume that this transverse motion gives rise to wave propagation of similar form to Eq. (60) along the z-axis, possibly through a transducer action of the block. Acoustic measurements were made with either one or both coils energised.

For just one coil the unscreened acoustic source amplitude $A_O$ is given by $$A_O = A_O e^{2\pi f t} \tag{62}$$

From Eqs. (60) and (62) the noise attenuation A in dB is therefore $$A = -20\log_{10}(|2A_1/A_O|\sin(\pi \times f/v)) \tag{63}$$

Figure 26:
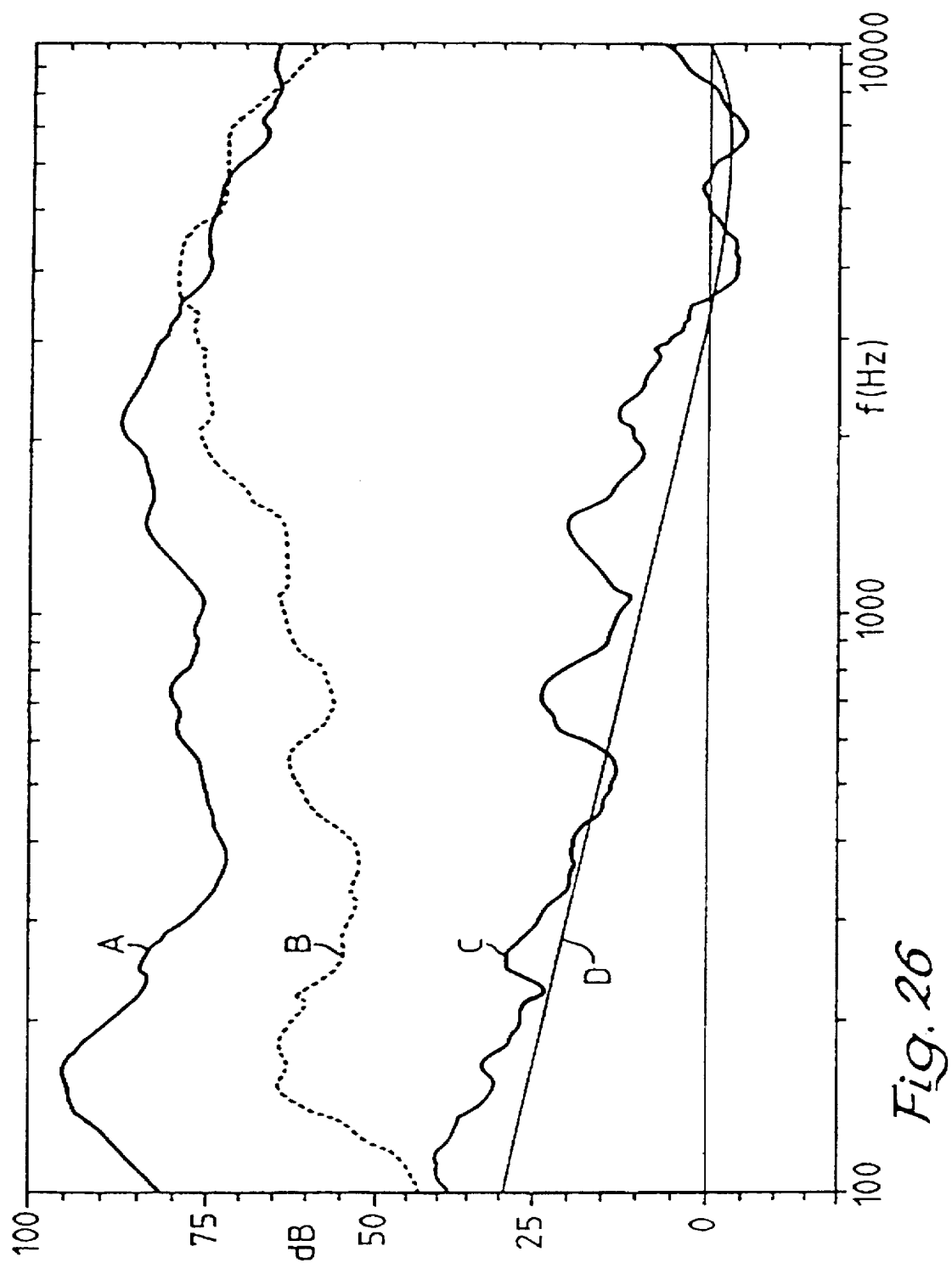
FIG. 26 is a graph showing sound pressure level attenuation A (dB) versus frequency (Hz) for the test coil arrangement of FIG. 25 when driven by sinusoidal current with peak value of 10 A.

FIG. 26 shows experimental acoustic noise attenuation data when either one, curve A, or two coils, curve B, are pulsed with a 10 A sinusoidal current provided from a TECHRON (Trade Mark) amplifier (not shown). These results are obtained using an electret microphone, (not shown) type EK3033, KNOWLES (Trade Mark), the output of which was fed through a 20 dB gain preamplifier to a HEWLETT PACKARD (Trade Mark) network analyser (HP8751A). The network analyser output was used to drive the TECHRON gradient power amplifier. Curve C is the experimental attenuation which is the difference between curves A and B. Also plotted on FIG. 26, curve D, is the theoretical expression, Eqn. (10) with $A_1/A_O=0.707$, $v=0.975\times10^3$ ms$^{-1}$ and x=0.075 m.

Deviation from unity of the ratio $A_1/A_O$ could be associated with force imbalance when only one coil is energised, effectively increasing the acoustic wave amplitude $A_O$. Alternatively, it could arise from the fact that the wires give rise to cylindrical waves. Ribbon conductors may better approximate to the launch of plane waves. The value of v was chosen for optimum fit. Calculated values of v for polystyrene lie in the range $(1.15–2.02)\times10^3$ ms$^{-1}$.

The data show a positive attentuation of about 40 dB at 100 Hz dropping to 0 dB at 3.5 kHz. The theoretical expression gives a reasonable fit to the smoothed data and confirms the essential correctness of the theoretical approach described below. In a loss-less material, A would peak periodically at higher frequencies. This behaviour has not been observed in experiments, presumably because $\alpha \neq 0$.

An important consideration in the extension of acoustic screening in gradient coil design is gradient efficiency. Acoustic screening inevitably reduces gradient strength. The question is therefore whether the acoustic attenuation achieved is then vitiated when coil current is increased to make up gradient amplitude shortfall.

Figure 25B:
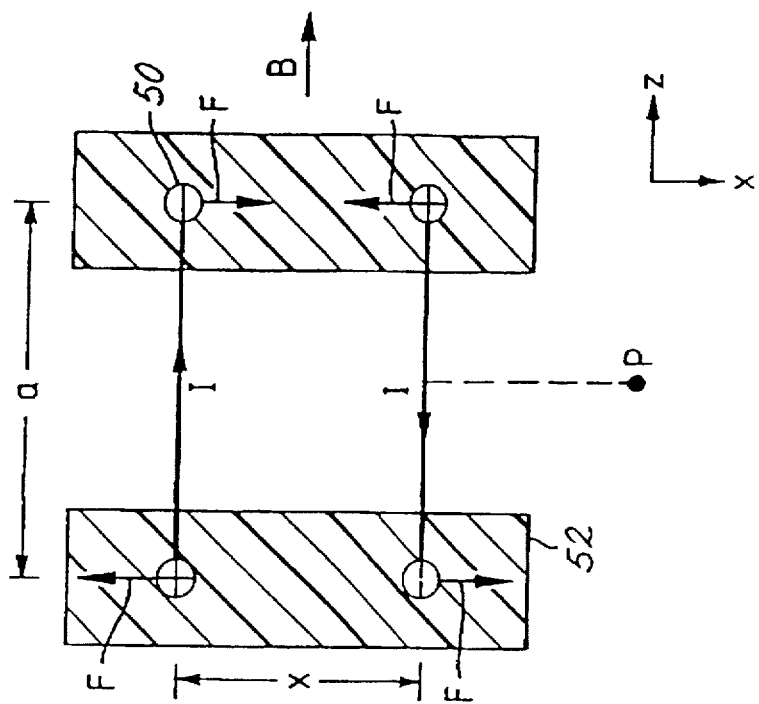
FIG. 25b shows a plan view of test coil comprising 2 rectangular loops of width a and length b wherein coils are spaced a distance x apart and planes of coils are parallel with B.
Figure 25A:
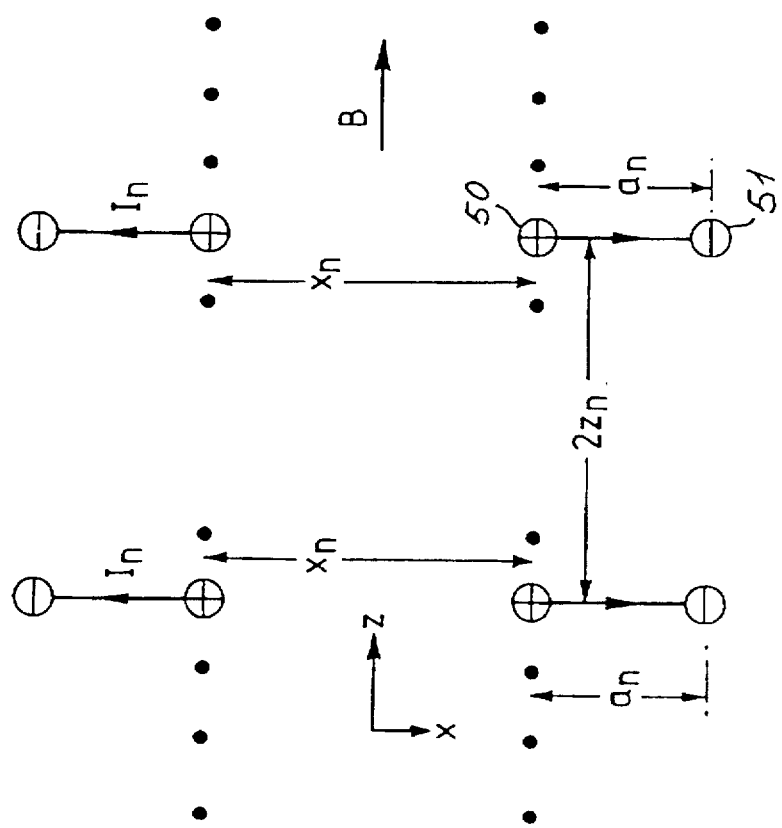
FIG. 25a is a diagram showing a plan view of the nth quartet of rectangular current loops from a set of quartets arranged to produce a magnetic field gradient along the x-axis, wherein all currents in central wires of the nth quartet have the same sense.

Experiments indicate that at point P, FIG. 25b, at a distance of 10 cm normal to one coil plane centre the relative magnetic field change from unscreened to screened is 3.16 T indicating that a factor of approximately 3 increase in current drive is required to restore the full magnetic field strength at that point. In separate experiments it was established that acoustic attenuation varies linearly with coil current drive. Thus a 3-fold increase in current will reduce the achievable acoustic attenuation by 9.5 dB. However, from the results, there should still be an acoustic attenuation advantage for frequencies below approximately 1 kHz. To improve matters wire encasing/potting materials are required which produce a higher propagation velocity v. In a full gradient coil design, depending on dimensions, the current increase required to restore gradient strength to that achievable without acoustic screening may well be arranged to be only a factor of 2 reducing the achievable acoustic attenuation in that case by 6 dB.

In the above descriptions of coil arrangements the use of the terms "individual wires" to form the primary coil and various force screen and magnetic screen has been emphasised. Alternative fabrication methods can equally well be used. For example, the conductor path layouts for each cylindrical surface of the coil arrangement can be produced from a solid copper or other metal sheet by an etching process. Yet another alternative is to cut out the wire paths from a copper or other metal sheet using a milling cutter or a fluid jet cutter.

A further embodiment of the invention which incorporates active acoustic screening and active magnetic screening and is an extension of the invention as outlined above with reference to FIGS. 4, 5, 6, 7, 14, 15, 16, 17, 18 and 19, is described below with reference to FIGS. 27 to 29. Although it was possible to magnetically screen any one of the coil configurations contained in FIGS. 4–7 and 14–19, in order to achieve active acoustic screening of the magnetic screen, two additional cylindrical surfaces were required. The first to support the active magnetic screen and the second defining its active acoustic screen. In the present additional embodiment a systematic way of magnetically screening a gradient coil structure, of the type outlined in any one of FIGS. 4–7 and 14–19 above is now described. In particular the arrangement is capable of being incorporated into the case of a cylindrical symmetric gradient arrangement, comprising closed arc loops as for example are shown in FIG. 7, FIG. 15 and FIG. 16.

In understanding this additional embodiment it is helpful to consider FIG. 27 which shows a single closed arc loop carrying current I with an included angle of $2\phi_O$ in which the inner radius is $\rho_s$ and the current return lies on a radius $\rho_F$. We consider the closed coil loops lie wholly in an x,y-plane and find an expression for the magnetic field strength $B_z$ which lies along the z-axis orthogonal to the x,y-plane. For $\rho<\rho_s$ the field $B_z$ is given by $$B_z = \qquad (64)$$

$$\frac{\mu_0}{\sqrt{(2\pi^3)}} \sum_{m=-\infty}^{m=\infty} (1-e^{-im\pi}) \int_{-\infty}^{\infty} dk e^{ikz} e^{im\phi} c(k) \frac{\sin m\phi_O}{m} k I_m(k\rho) \times$$

$$\int_{\rho_S}^{\rho_F} d\rho' k\rho' K_m(k\rho')$$

where $I_m(k\rho)$ and $K_m(k\rho)$ are modified Bessel functions and $m=1,3,5\ldots$ is the harmonic order of the field in the polar angle $\phi_O$. $\mu_O$ is the magnetic moment of free space. For $\rho>\rho_F$ the magnetic field is given by $$B_z = \qquad (65)$$

$$\frac{\mu_0}{\sqrt{(2\pi^3)}} \sum_{m=-\infty}^{m=\infty} (1-e^{-im\pi}) \int_{-\infty}^{\infty} dk e^{ikz} e^{im\phi} c(k) \frac{\sin m\phi_O}{m} k K_m(k\rho) \times$$

$$\int_{\rho_S}^{\rho_F} d\rho' k\rho' K_m(k\rho')$$

where c(k) is the spatial Fourier transform given by $$c(k) = \frac{1}{\sqrt{2\pi}} \int_{-\infty}^{\infty} dz\, e^{-ikz} c(z) \qquad (66)$$

in which c(z) is the distribution of arcs along the z-axis and k here is the conjugate or reciprocal space displacement of z. In an actual coil gradient a symmetric arrangement of at least four closed arc loops would be disposed, as indicated in FIG. 7. Alternatively a distribution of more than four loops as indicated in FIGS. 15 and 16 may be used.

As emphasised previously, provided that the current loops are closed, the total forces and torques in each separate loop balance provided that there are suitable struts or supporting material to constrain and enclose the arc loop wires. FIG. 27 together with equations 64 to 66 show how an arrangement of nested closed arc loops may be designed using the closed form expressions. One quadrant of a quartet is shown in FIG. 28. In this arrangement the angular displacements can be chosen to optimise the required character of $B_z$ for a particular value of m. By eliminating the higher orders in m, the purity of the magnetic field generated within the coil arrangement can be improved. The fact that closed form expressions can be produced for the magnetic field strength within and outside the coil structure permits the same mathematical formalism to be used to create a set of nested loops which can be arranged to magnetically screen the primary coil arrangement. An example of this is shown in FIG. 29 where again a section of a gradient coil structure is shown. The nested loops 60 represent part of the primary gradient coil system generating a gradient to a particular order m and character $\phi_2$. The coil loops 62 comprise the active magnetic screening and have similar polar angular displacements to the primary coil as shown in FIG. 29. However, the currents and radii of the loops 60 are arranged to magnetically screen a similar primary coil structure 62a, b and c as is shown in FIG. 29. With this arrangement active magnetic screening is achieved and each closed arc loop, whether in the primary coil or in the magnetically screened coil, is at all times force balanced (and therefore torque balanced) provided that all the gradient coil structures lie in planes which are orthogonal to the applied static magnetic field, which in this case lies along the z-axis.

An alternative active magnetically screened strategy to the one shown in FIGS. 27 to 29, is to create a screening coil on a cylinder of radius b which lies outside the radius $\rho_F$. In this case the current distribution necessary to screen the primary gradient coil (comprising a set of closed arc loops) is given by $$J_\phi^m(k) = 2\left(\frac{2}{\pi}\right)^{1/2} \frac{\sin m\phi}{m} \int_{\rho_S}^{\rho_F} \frac{k\rho' I_m(k\rho')d\rho'}{bI'_m(kb)} c(k) \qquad (67)$$

where the spatial Fourier transform $J_\phi^m(k)$ is defined by $$J_\phi^m(k) = \frac{1}{2\pi} \int_{-\infty}^{\infty} dz \int_{-\pi}^{\pi} d\phi J_\phi(z,\phi) e^{-ikz} e^{-im\phi}. \qquad (68)$$

The polar current density in real space $J_\phi(z,\rho)$, describes the actual current density on the active screen, although a continuous function would be replaced by wires following the stream functions on that surface. Using a single active magnetic screen would to some extent vitiate the acoustic screening achieved at the primary coil in this arrangement, but if radius b of the active screen is large enough the surface current density and therefore the current in the screening coil can be quite small, thereby minimising the Lorentz forces on this screen.

A preferred method of screening as mentioned previously is to screen the primary coil by a second distribution of closed arc loops and in this case the condition for complete magnetic screening of the inner coil is given by $$d(k) = c(k) \times \frac{\int_{\rho_S'}^{\rho_F'} k\rho' I_1(k\rho')d\rho'}{\int_{\rho_S'}^{\rho_F'} k\rho' I_1(k\rho')d\rho'} \quad (69)$$

where $\rho_S'$ and $\rho_F'$ are the inner and outer radii respectively of the magnetic screening arc loops labelled B in FIG. 29 and where $$d(k) = \frac{1}{\sqrt{2\pi}} \int_{-\infty}^{\infty} dz\, d(z)e^{-ikz} \quad (70)$$

in which $d(z)$ is the spatial distribution of screening arcs along the z-axis required to magnetically screen the spatial distribution of closed arcs, $c(z)$, which comprise the primary gradient coil. Eqn. 69 shows that the screening condition is evaluated for m=1 only. It is not a necessary condition that the primary arc loops and screening arc loops lie in the same plane. For the generation of purer or higher order magnetic fields or magnetic field gradients, additional arc loops with a range of polar angles $\phi_l$ are required as indicated in FIGS. 28 and 29. A condition that all orders up to and including the (2N+1)th order vanish is that the following expression must be satisfied:

$$\sum_{l=0}^{l=N} \sin m\phi_l = \delta_{m,1}. \quad (71)$$

This expression can be satisfied for particular values of m; as an example for $\phi_0=\pi/3$. The third order m=3 vanishes in Eq. 64, leaving m=5 as the lowest non-vanishing order in the field expansion.

The arrangement of closed arc loops for both primary and magnetic screening coils lends itself to a simple method of individual arc loop construction. Instead of flooding the whole coil arrangement with potting resin, a further alternative arrangement is to have each wire in an arc loop in the form of a flat strip which can then be recessed into a reasonably tightly fitting slot which has been machined out of a sheet of suitable material. The arrangement is indicated in FIG. 30a. This arrangement ensures that individually mounted wires generate very little acoustic noise provided that the material is chosen correctly as described above. If more than one wire is required in a particular arc loop, it is proposed as an alternative arrangement, that each wire be recessed tightly into its own supporting plate and that the plates be mounted on spacer and support rods as sketched in FIG. 30b. In this way relative motion between wires, were they to be wound over each other, is completely eliminated without the need for vacuum impregnation techniques which would allow plastic resins etc. to fully penetrate wire bundles. The above outlined method may also lend itself more easily to the use of more exotic support materials like certain types of ceramic sheet and pyrothalite block. In this latter material before firing it is perfectly machinable and would allow slots, holes, and the like to be machined. When it is fired such materials turn into a ceramic like material which is no longer machinable. It may also be possible to use glass or glassy materials in a similar way.

In the above mounting procedures the rectangular or circular section conductor is inserted in the slot and suitable adhesive material, possibly epoxy resin, or some other very hard setting polymer resin is poured in to prevent residual movement of wire when pulsed in a magnetic field. The advantage of using ceramics is the very high acoustic velocity in such materials which as stated in the experimental section above give better high frequency acoustic cancellation in force balanced coils.

From the acoustic propagation theory and from the agreement with experimental results, the attenuation A (Eqn. 63) is a function of $\sin(\pi x f/v)$. We have so far accentuated the fact that to keep the argument of sin ($\pi x f/v$) small for all frequencies we require ideally that the wave propagation velocity v is large. A number of possibilities for selecting suitable materials to satisfy this requirement are described above. However, in the experimental results produced a loaded polystyrene resin was used and typical wave velocities for this material are around 1 km s$^{-1}$. The experimental results show that for x=7.5 cm the block becomes resonant at about 6 or 7 kHz. Bearing in mind that materials with much higher wave velocities could be difficult to machine and very expensive, an alternative approach is to use polystyrene, but reduce the value of x in the sine argument. Under normal circumstances reducing x will drastically reduce the achievable magnetic field gradient, thereby necessitating much higher drive currents.

In a further embodiment of the invention, where magnetic field gradients are produced by a series of closed arc loops, as in FIGS. 5, 6, 7, 12, 14, 15, 16 and 17 each large loop is replaced by a number of smaller loops to form a composite force screen. The total area of the smaller closed loop structures is ideally equal to the area of the single large loop which it replaces.

An example of this embodiment is shown in FIG. 33a, and comprises a substantially rectangular closed loop of width 2x, FIG. 33b. This is magnetically equivalent to two loops of width x as seen in FIGS. 33a to 33b, provided that adjacent wires of the two loops are reasonably close to each other. This follows from Ampere's circuital theorem. Thus, although the two circuits are magnetically equivalent, they will not be acoustically equivalent. Each small segment of the composite coil is encased in a suitable material with a propagation constant k. The gap, g, between adjacent coils is lightly coupled by a material with propagation constant $k_1$. In this arrangement it is important to make sure that the wires in each segment are in anti-nodal positions. This means that ideally at a particular frequency f, $x=\lambda/2$ and also $g=\lambda/2$, as indicated in FIG. 34. For Ampere's circuital theorem to hold, however, $g<<x$. This in turn means that the propagation velocity in the gap $v_1$ must be given by $v_1=(g/x)v$. It is relatively easier to find materials with lower wave velocities and this latter condition should therefore be easier to satisfy.

Figure 33C:
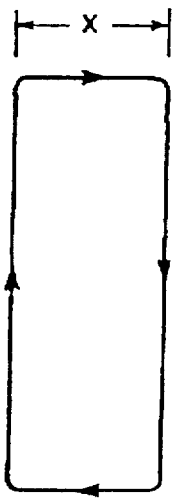
Figure 33C:
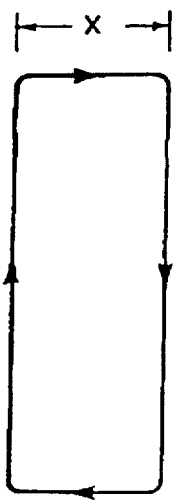
Figure 33C:
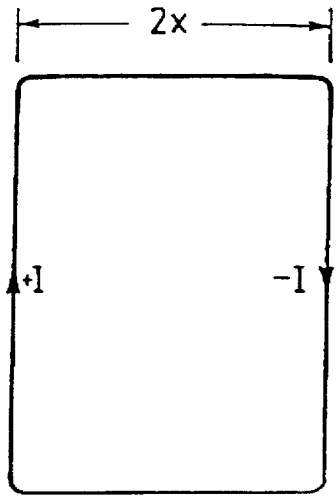
Figure 33C:
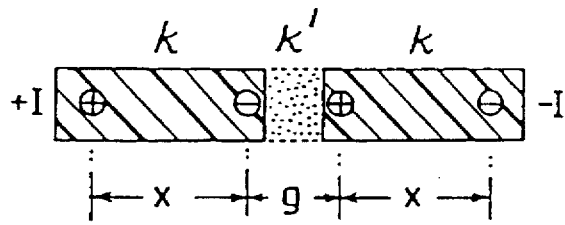
Figure 34:
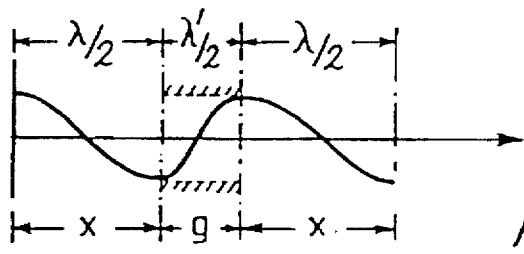

An alternative approach is to not fill the gap, in FIG. 33c, but to allow a small air space so that the two composite coils are free to move. The important point is that if coils touch or if the arrangement is moulded as a whole, two adjacent wires with equal and opposite currents will essentially form an acoustic node which vitiates the result.

Figure 35:
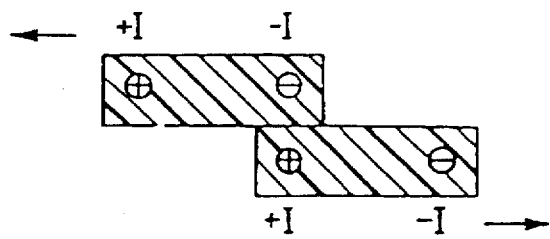

Yet a further alternative is to mount each sub coil on its own plate in the form of FIG. 35. If the plates and wires are thin enough the effect of displacing the two flat coils by one wire thickness will not vitiate the magnetic equivalence. In all that we have described the effect of replacing a single hoop by a set of n loops is to push the structural resonance frequency from $v/\lambda$ to $nv/\lambda$. This in turn means that the 0 dB crossing in FIG. 26 is pushed to much higher frequencies for the same potting material. That is to say, for n loops the attenuation A, (Eqn. 63), becomes a function of $\sin(\pi fx/nv)$. With this approach it will be possible to maintain high acoustic attenuation over a much wider frequency range.

FIGS. 36 to 42 show various embodiments of the principle for composite force screen closed loop structures. FIG. 36a, b and c show a composite rectangular loop made up of three segments and its magnetic equivalent single loop. Also shown in plan view is a possible construction method using sliding lap joints. FIGS. 37a, b and c show a composite arc loop made up of three closed arc sections and its single loop magnetic equivalent. Also shown in side elevation is a possible construction method using sliding lap joints. FIG. 38a, b and c show a composite hoop coil comprising two force balanced hoops together with its magnetic equivalent. Again a possible construction method is shown using sliding lap joints as in FIG. 38c.

Figure 38C:
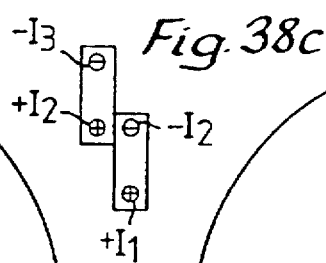
Figure 38A:
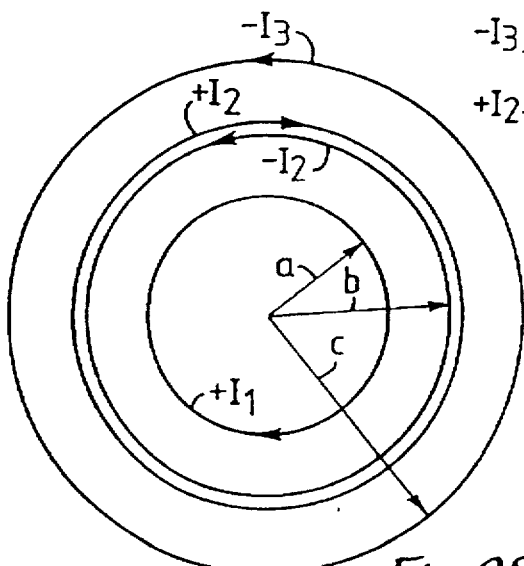

It is emphasised that in the closed rectangular and closed arc loops the current in all segments is equal. For properly force balanced hoops the currents should be in the following ratios: for the segmented hoops $I_2=-I_1$ (a/b); $I_3=I_2$ (b/c) giving for the magnetic equivalent force screen coil $I_3=-I_1$ (a/c) as shown in FIGS. 38a and b.

Similar segmentation can be used to form composite force screened open loop structures. Examples of this are shown in FIGS. 39 to 41. FIG. 39a, b and c show a segmented straight wire open loop force balanced arrangement and its magnetic equivalent, together with a possible construction method using the sliding lap joint principle. FIG. 40a, b and c show a segmented open arc loop force balanced arrangement and its magnetic equivalent, together with a possible construction method using the sliding lap joint principle. FIG. 41a and b show a composite segmented force screen for an open arc structure which forms part of a cylindrical surface current distribution. In this arrangement the force screen for the primary coil is made up of two cylindrical segments. The two cylindrical segments are suitably potted in a polymer material but are spaced from each other by thin rubber strips to allow adjacent conductors in each segment to form acoustic anti-nodal cylindrical surfaces.

Figure 36A:
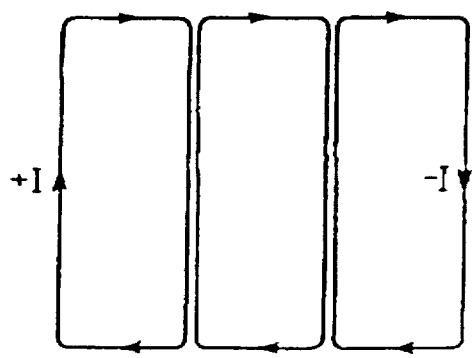
Figure 36B:
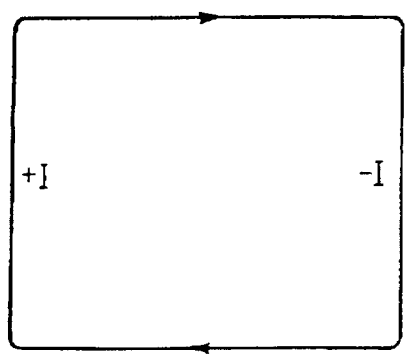
Figure 36C:
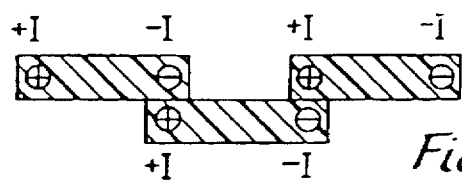

FIG. 36a shows three composite closed loops, which are magnetically equivalent to the single closed loop in FIG. 36b. FIG. 36c shows an end view of the three loops embedded in slabs of potting material. Each loop is able to move, with respect to the other two. The direction of movement of each slab is in a plane, in which the slab is disposed.

Figure 37A:
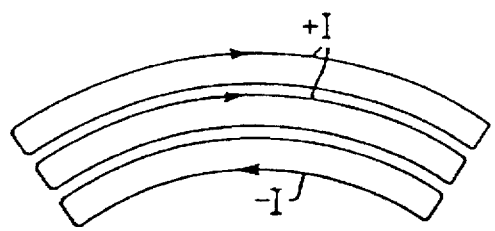
Figure 37C:
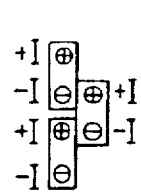
Figure 37B:
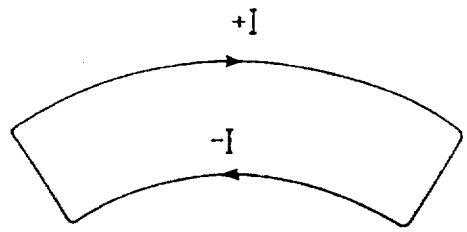

FIG. 37a shows composite closed loops equivalent to the closed loop in FIG. 37b. The composite closed loops are arcuate. FIG. 37c is a side view of FIG. 37a.

Figure 38B:
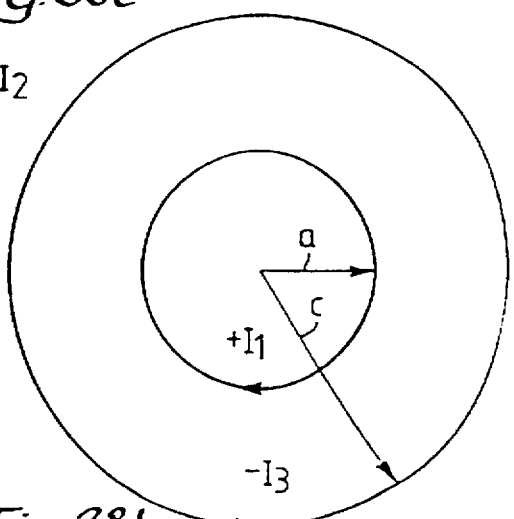

FIG. 38a shows composite closed loops which are in the form of hoops and are equivalent to the single hoop shown in FIG. 38b. FIG. 38c is a side view of FIG. 38a. Open arc composite loops are shown in FIGS. 39a and 40a. End views are shown in FIGS. 39c and 40c respectively. The open composite loop equivalents are shown in FIGS. 39b and 40b, respectively. The composite arcuate, open loop coils, shown in FIGS. 40a and 40c subtend the same angle.

FIG. 41b shows a partialy sectioned view of an arrangement 200 comprising coils 210,212,230 and 232. The coils are embedded in potting material. Outer potted coil support 220 is spaced from inner potted coil support 240 using compressible rubber spacers 250. The inner diameter 260 is where an object (for example a patient) is placed for imaging.

It will be appreciated that the embodiments described above are examples only and variation may be made to them without departing from the scope of the invention.

TABLE 1

Short solenoid inductance correction factors

|   | 0 | 0.5 | 1 | 10 |
|---|---|-----|---|----|
| E | 1 | 0.8 | 0.7 | 0.2 |

TABLE 2

Insert gradient coils specifications

| Type | Axial (Maxwell) | Transverse X | Transverse Y |
|---|---|---|---|
| Radius primary (m × $10^{-2}$) | 22.25 | 22.5 | 22.5 |
| Radius Force Screen (m × $10^{-2}$) |  | 32.5 | 32.5 |
| Posn. 1st arc (m × $10^{-2}$) | 19.25 | 7 | 8 |
| Arc length (degrees) | 360 | 120 | 120 |
| Gradient (Tm$^{-1}$) ($A^{-1}$ × $10^{-6}$) | 130 | 61 | 61 |
| No. of turns | 8 | 9 | 9 |
| Wire (axial width) (m $10^{-3}$) | 4.5 | 4.5 | 4.5 |
| Wire (radial depth) (m $10^3$) | 2.24 | 2.24 | 2.24 |
| Resistivity (ohm m$^{-1}$ × $10^{-3}$) | 1.78 | 1.78 | 1.78 |
| Total resistance (ohm) | 0.16 | 0.34 | 0.34 |
| Inductance (Henry × $10^{-6}$) | 192 | 2 269 | 269 |

TABLE 3

Fully Force Balanced Screened Surface Current Distributions

Figure 20B:
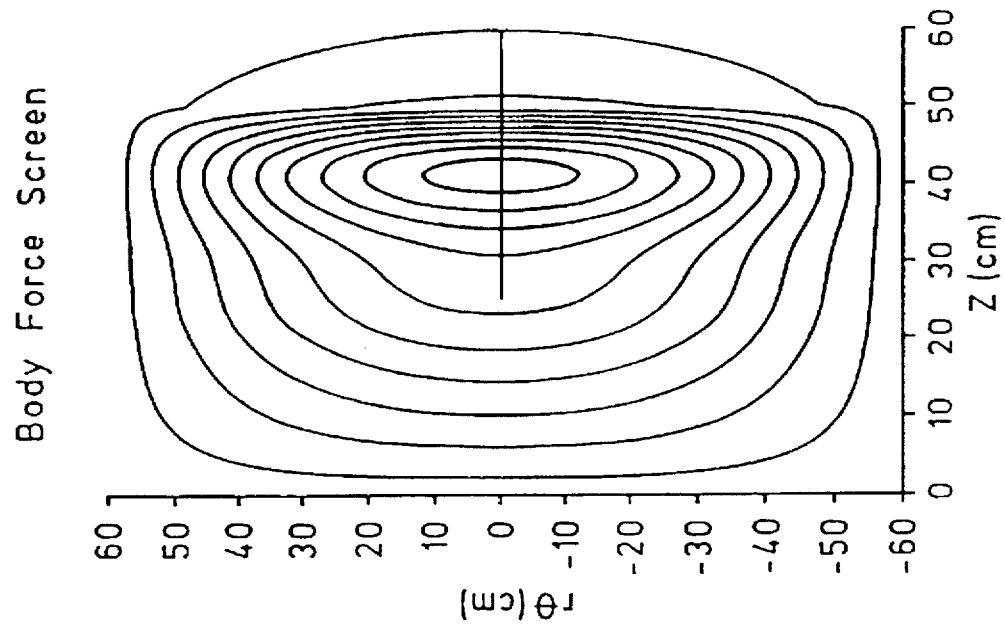
FIG. 20 shows the wire paths for one quadrant of a distributed whole body quiet gradient coil arrangement, (a) shows wire positions for the primary coil; (b) shows wire positions for the combined primary/magnetic screen acoustic screen; and (c) shows wire positions for the active magnetic screen.
Figure 20A:
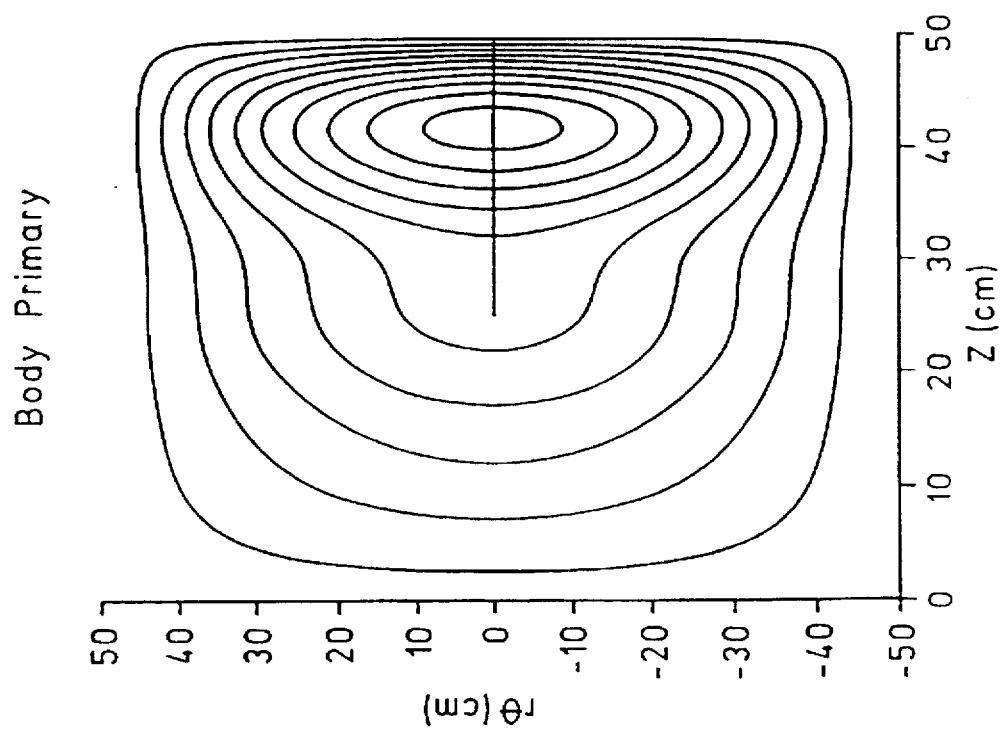
Figure 20C:
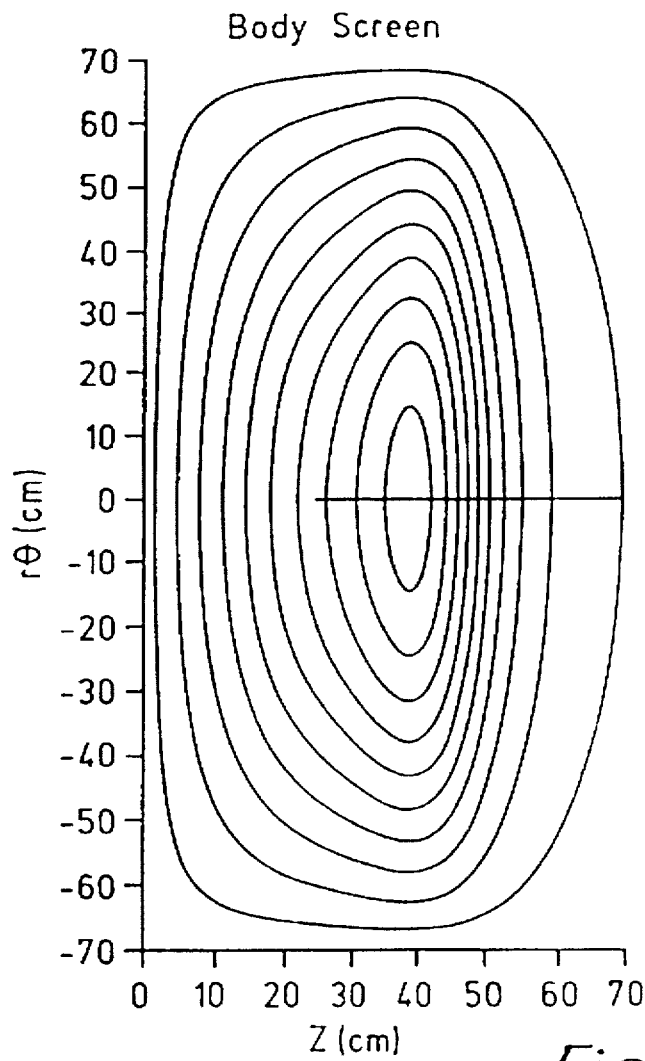

| Surface | Radius (cms) | Total Current (Amp)* |
|---|---|---|
| Primary (FIG. 20(a)) | 30 | 8,313 |
| Force Screen (FIG. 20(b)) | 38 | −10,245 |
| Magnetic Screen (FIG. 20(c)) | 45 | 3,199 |

*For a field of 10 mT/m or 0.0012 mT/m per primary Amp-turn.

TABLE 4

Comparison of loop designs

| Type | 1. Line element | 2. Loops (120°) | 3. Loops |
|---|---|---|---|
| Gradient (Tm$^{-1}$A$^{-1}$ × $10^{-6}$) | 61 | 49 | 51 |
| Quality (max) | *89 | 51 | 72 |
| Quality (min) | *23 | 46 | 30 |
| No. of turns (per quadrant) | 9 | 20 | 20 |
| Inductance (Henry × $10^{-6}$) | 269 | 184 | 93 |
| Resistance (Ohm) | 0.34 | 0.76 | 0.44 |

*This is over a cylindrical ROI of length and diameter 20 cm, which region extends axially beyond the bounds of this coil structure. The useful region for this coil is a cylinder of diameter 20 cm and length 10 cm. The two points of maxima (10, 10, 8) and minima (10, 10, 0) are outside this region. They were included for purposes of comparison only.

TABLE 5

Fully Force Balanced Screened Surface Current
Distributions Utilising the Force Screen for return paths.

| Surface | Radius (cms) | Total Current (Amp)* |
|---|---|---|
| Primary (FIG. 22(a)) | 30 | 8,421 |
| Force Screen (FIG. 22(b)) | 38 | −12,832 |
| Magnetic Screen (FIG. 22(c)) | 45 | 5,239 |

*For a field of 10 mT/m or 0.0012 mT/m per primary Amp-turn.

We claim:

1. An active acoustically screened magnetic gradient coil, which is adapted to be placed in a static magnetic field, the coil comprising a plurality of electrically conductive pathways, the pathways forming closed loops which carry oscillating current, such that the integral of Lorentz forces acting around the loop, when the loop is placed orthogonal to a static magnetic field is substantially zero, wherein a nominal projected area, onto a plane normal to the direction of the magnetic field, enclosed by each closed loop, is substantially equivalent to a nominal projected area, onto the said plane, enclosed by a composite loop and all portions of the loop are mechanically coupled by a potting material, the ratio of whose elastic modulus and density are such that the velocity of sound in the potting material is maximized.

2. A coil according to claim 1 wherein the closed loop comprises first and second arcuate portions.

3. A coil according to claim 2 wherein the arcuate portions subtend an angle of substantially 120°.

4. An arrangement comprising a plurality of active acoustically screened magnetic gradient coils, each said coil being adapted to be placed in a static magnetic field and comprising:

a plurality of electrically conductive pathways, the pathways forming closed loops which carry oscillating current, such that the integral of Lorentz forces acting around the loop, when the loop is placed orthogonal to a static magnetic field is substantially zero, wherein a nominal projected area, onto a plane normal to the direction of the magnetic field, enclosed by each closed loop, is substantially equivalent to a nominal projected area, onto the said plane, enclosed by a composite loop and all portions of the loop are mechanically coupled by a potting material, the ratio of whose elastic modulus and density are such that the velocity of sound in the potting material is maximized, wherein the planes in which coils are positioned, are at a distance z from a datum, so as to optimize the gradient field, z being calculated analytically using a reciprocal space formalism expression relating path position in space and resulting magnetic field variation.

5. An arrangement comprising a plurality of coils according to claim 4, wherein the coils are nested.

6. An arrangement according to claim 5, wherein the first and second pathways are embedded in a first material, so as to form first and second slabs and a second material is placed between the slabs, the first and second materials having different propagation constants for the velocity of sound.

7. An arrangement according to claim 6, wherein the slabs are displaceable with respect to one another.

8. An arrangement according to claim 7, wherein the slabs are displaceable in planes in which they are disposed, said planes being parallel or coplanar.

9. An active acoustically screened coil, which is adapted to be placed in a static magnetic field, the coil comprising a plurality of electrically conductive pathways, the pathways forming closed loops which carry an oscillating current, such that the integral of Lorentz forces acting around the loop, when the loop is placed orthogonal to a static magnetic field is substantially zero, characterized in that a nominal projected area, onto a plane normal to the direction of the magnetic field, enclosed by each closed loop, is substantially equivalent to a nominal projected area, onto the said plane, enclosed by a composite loop and all portions of the loop are mechanically coupled by a potting material, the ratio of whose elastic modulus and density are such that the velocity of sound in the potting material is maximized.

10. A coil according to claim 9, wherein the closed loop comprises a first and second arcuate portions having different radii of curvature.

11. An arrangement comprising a plurality of coils according to either claim 9 or 10 wherein the coils are nested.

12. An arrangement according to claim 11 wherein the coils are distributed in a plurality of planes, the planes being substantially normal to a static magnetic field.

13. An arrangement according to claim 11, wherein the planes in which coils are positioned, are at a distance z from a datum, z being calculated analytically using a reciprocal space formalism expression relating path position in space and resulting magnetic field variation.

14. An arrangement according to claim 13, wherein first and second pathways are embedded in a first material, so as to form first and second slabs and a second material is placed between the slabs the first and second materials having different acoustic compressional wave propagation constants for the velocity of sound.

15. An arrangement according to claim 14, wherein each pathway is embedded in a material such that slabs of material may move with respect to one another.

16. An arrangement according to claim 15, wherein the slabs may be displaced with respect to one another.

17. An arrangement according to claim 11, wherein each coil is actively magnetically screened.

* * * * *